(12) United States Patent
Byun

(10) Patent No.: US 11,832,382 B2
(45) Date of Patent: Nov. 28, 2023

(54) PRINTED CIRCUIT BOARD AND A STORAGE SYSTEM INCLUDING THE SAME

(71) Applicant: SAMSUNG ELECTRONICS CO., LTD., Suwon-si (KR)

(72) Inventor: Jae Beom Byun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 208 days.

(21) Appl. No.: 17/518,982

(22) Filed: Nov. 4, 2021

(65) Prior Publication Data

US 2022/0264738 A1 Aug. 18, 2022

(30) Foreign Application Priority Data

Feb. 17, 2021 (KR) .......................... 10-2021-0021189

(51) Int. Cl.
 *H05K 1/00* (2006.01)
 *H05K 1/02* (2006.01)
 *H05K 5/02* (2006.01)

(52) U.S. Cl.
 CPC ......... *H05K 1/0212* (2013.01); *H05K 5/0213* (2013.01); *H05K 5/0247* (2013.01); *H05K 2201/10159* (2013.01)

(58) Field of Classification Search
 CPC .. H05K 1/0212; H05K 5/0213; H05K 5/0247; H05K 2201/10159
 See application file for complete search history.

(56) References Cited

U.S. PATENT DOCUMENTS

| | | | |
|---|---|---|---|
| 7,489,578 B2 | 2/2009 | Park | |
| 8,866,309 B2 | 10/2014 | Chang et al. | |
| 9,693,446 B2 | 6/2017 | Ragg | |
| 10,600,948 B1 | 3/2020 | Liu | |
| 10,797,367 B2 | 10/2020 | Takahashi et al. | |
| 2012/0062041 A1* | 3/2012 | Nelson | G01K 7/24 307/116 |
| 2015/0138735 A1* | 5/2015 | Oh | H05K 1/181 361/736 |
| 2019/0018986 A1 | 1/2019 | Choi et al. | |
| 2019/0104568 A1* | 4/2019 | Krueger | H05B 1/0236 |

FOREIGN PATENT DOCUMENTS

| | | |
|---|---|---|
| JP | 2007-309970 | 11/2007 |
| KR | 10-2011-0075230 | 7/2011 |

\* cited by examiner

*Primary Examiner* — Pete T Lee
(74) *Attorney, Agent, or Firm* — F. Chau & Associates, LLC

(57) ABSTRACT

A printed circuit board (PCB) including: a negative thermal coefficient (NTC) thermistor which provides an electrical signal received from outside the PCB, wherein an electrical resistance of the NTC thermistor varies according to a negative thermal coefficient; and a heating pattern which receives the electrical signal from the NTC thermistor, wherein the heating pattern includes a positive thermal coefficient (PTC) thermistor with an electrical resistance that varies according to a positive thermal coefficient, wherein the PTC thermistor has a first thermal coefficient of resistance at a first critical temperature or below and changes to a second thermal coefficient of resistance above the first critical temperature, and the NTC thermistor has a third thermal coefficient of resistance at a second critical temperature or below and changes to a fourth thermal coefficient of resistance above the second critical temperature.

20 Claims, 19 Drawing Sheets

PRINTED CIRCUIT BOARD AND A STORAGE SYSTEM INCLUDING THE SAME

This application claims priority under 35 U.S.C. § 119 to Korean Patent Application No. 10-2021-0021189, filed on Feb. 17, 2021, in the Korean Intellectual Property Office, the disclosure of which is incorporated by reference herein in its entirety.

1. TECHNICAL FIELD

The present disclosure relates to a Printed Circuit Board (PCB) and a storage system including the same.

2. DESCRIPTION OF THE RELATED ART

An automotive infotainment system and an autonomous driving system for controlling a vehicle are being developed. Various application programs may run on the automotive infotainment system and the autonomous driving system. Various electronic devices in the automotive infotainment system and the autonomous driving system may include semiconductor devices such as a nonvolatile memory, a working memory (e.g., a dynamic random access memory (DRAM)) and an application processor, to drive the application programs.

A sudden rise or fall in the temperature of a semiconductor device can greatly affect the performance and reliability of the semiconductor device. For example, a vehicle is highly likely to create an environment outside the standard temperature of the semiconductor device. Thus, if the semiconductor device is driven in this environment beyond a certain period of time, the semiconductor device may malfunction, potentially causing serious danger to the operation of the vehicle.

SUMMARY

Embodiments of the present disclosure provide a Printed Circuit Board (PCB) which rapidly and efficiently increases temperature to a driving temperature and ensures operational reliability of a memory device.

Embodiments of the present disclosure also provide a storage system which rapidly and efficiently increases temperature to a driving temperature and ensures operational reliability of a memory device.

According to an embodiment of the present disclosure, there is provided a PCB including: a negative thermal coefficient (NTC) thermistor which provides an electrical signal received from outside the PCB, wherein an electrical resistance of the NTC thermistor varies according to a negative thermal coefficient; and a heating pattern which receives the electrical signal from the NTC thermistor, wherein the heating pattern includes a positive thermal coefficient (PTC) thermistor with an electrical resistance that varies according to a positive thermal coefficient, wherein the PTC thermistor has a first thermal coefficient of resistance at a first critical temperature or below and changes to a second thermal coefficient of resistance above the first critical temperature, and the NTC thermistor has a third thermal coefficient of resistance at a second critical temperature or below and changes to a fourth thermal coefficient of resistance above the second critical temperature.

According to an embodiment of the present disclosure, there is provided a PCB including: a connector which provides an electrical signal received from outside the PCB; and a heating pattern which receives the electrical signal from the connector, wherein the heating pattern comprises a PTC thermistor with an electrical resistance that varies according to a positive thermal coefficient, wherein the PTC thermistor has a first thermal coefficient of resistance at a first critical temperature or below and changes to a second thermal coefficient of resistance above the first critical temperature, and the first critical temperature is in the range of −5 to 25° C.

According to an embodiment of the present disclosure, there is provided a storage system including: a memory device which stores data; a memory controller which requests the memory device to program the data; and a PCB on which the memory device and the memory controller are disposed and which provides an electrical signal to the memory controller, wherein the PCB includes: an NTC thermistor which provides the electrical signal received from outside the PCB, wherein an electrical resistance of the NTC thermistor varies according to a negative thermal coefficient; and a heating pattern which receives the electrical signal from the NTC thermistor and includes PTC thermistor, wherein an electrical resistance of the PTC thermistor varies according to a positive thermal coefficient, wherein the PTC thermistor has a first thermal coefficient of resistance at a first critical temperature or below and changes to a second thermal coefficient of resistance above the first critical temperature, and the NTC thermistor has a third thermal coefficient of resistance at a second critical temperature or below and changes to a fourth thermal coefficient of resistance above the second critical temperature.

DETAILED DESCRIPTION OF THE EMBODIMENTS

Figure 1:
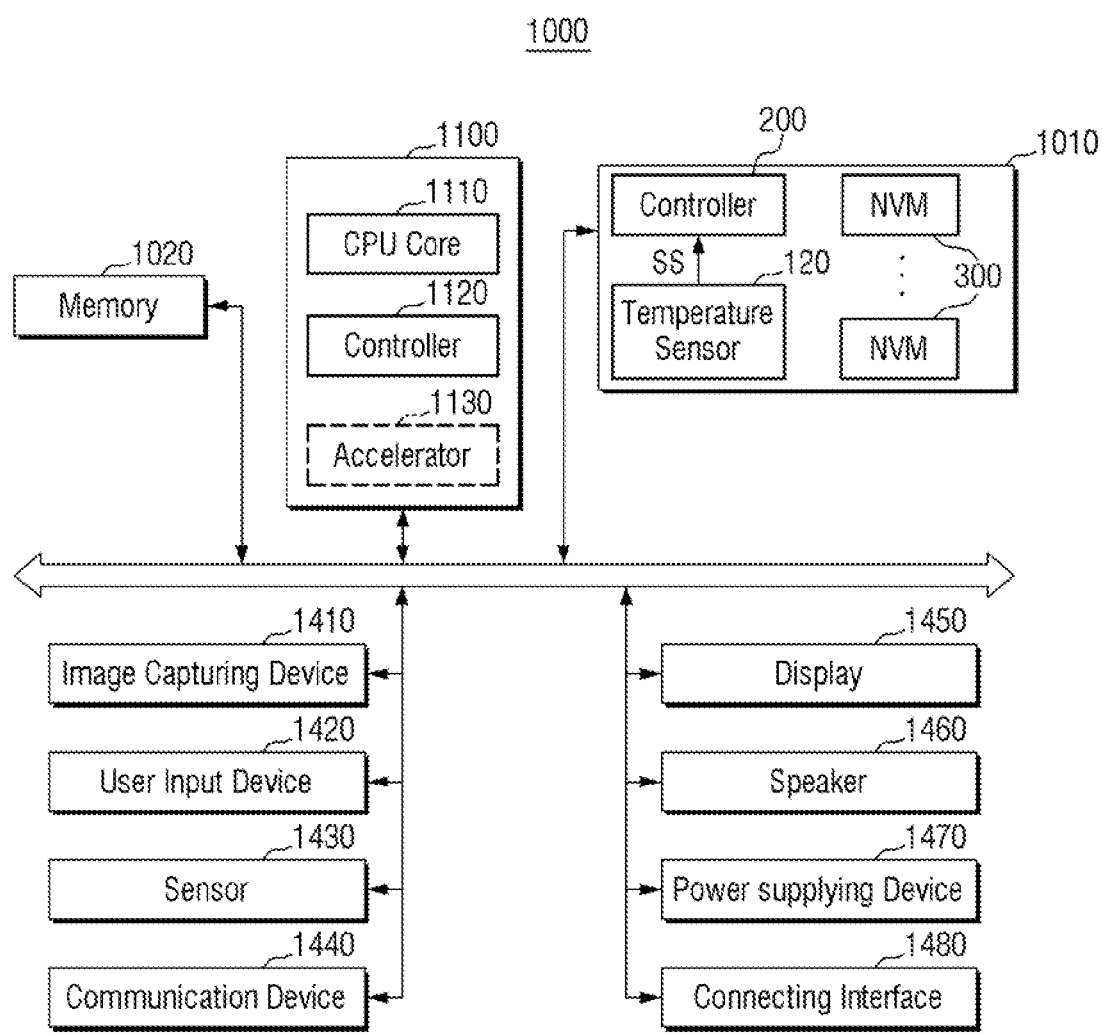
FIG. 1 is a block diagram of a system to which a storage system according to embodiments of the present disclosure is applied.

Hereinafter, embodiments of the present disclosure will be described with reference to the accompanying drawings. In the description of FIGS. 1 through 19, substantially the same components are identified by the same reference characters, and thus, any redundant description thereof may be omitted. In addition, similar components are identified by similar reference characters throughout the drawings of the present disclosure.

FIG. 1 is a block diagram of a system 1000 to which a storage system according to embodiments of the present disclosure is applied.

Referring to FIG. 1, the system 1000 of FIG. 1 may be a mobile system such as an automotive computer, a portable communication terminal (e.g., mobile phone), a smartphone, a tablet personal computer, a wearable device, a healthcare device, or an Internet of things (IOT) device. However, the system 1000 of FIG. 1 is not necessarily limited to the mobile system and may also be a personal computer, a laptop computer, a server, a media player, an automotive device such as a navigation device, or an autonomous driving system.

Referring to FIG. 1, the system 1000 may include a main processor 1100, a memory 1020 and a storage device 1010 and may additionally include one or more of an image capturing device 1410, a user input device 1420, a sensor 1430, a communication device 1440, a display 1450, a speaker 1460, a power supplying device 1470 and a connecting interface 1480. The components of the system 1000 may communicate with each other via a bus.

The main processor 1100 may control the overall operation of the system 1000, for example, the main processor 1100 may control the operation of other components constituting the system 1000. The main processor 1100 may be implemented as a general-purpose processor, a dedicated processor, or an application processor.

The main processor 1100 may include one or more central processing unit (CPU) cores 1110 and may further include a controller 1120 for controlling the memory 1020 and/or the storage device 1010. According to an embodiment of the present disclosure, the main processor 1100 may further include an accelerator block 1130 which is a dedicated circuit for a high-speed data operation such as an artificial intelligence (AI) data operation. The accelerator block 1130 may include a graphics processing unit (GPU), a neural processing unit (NPU) and/or a data processing unit (DPU) and may be implemented as a separate chip physically independent of other components of the main processor 1100.

The memory 1020 may be used as a main memory device of the system 1000 and may include a volatile memory such as a static random access memory (SRAM) and/or a dynamic random access memory (DRAM), but may also include a nonvolatile memory such as a flash memory, a phase-change random access memory (PRAM) and/or a resistive random access memory (RRAM). The memory 1020 may also be implemented in the same package as the main processor 1100. Although the memory 1020 is provided in a singular number in FIG. 1, the present disclosure is not limited thereto, and the memory 1020 may also be provided in plural numbers.

The storage device 1010 may function as a nonvolatile storage device that stores data regardless of whether power is supplied and may have a relatively larger storage capacity than the memory 1020. Although the storage device 1010 is provided in a singular number in FIG. 1, the present disclosure is not limited thereto, and the storage device 1010 may also be provided in plural numbers.

The storage device 1010 may include a memory controller 200, a temperature sensor 120 which provides a sensing signal SS to the memory controller 200, and nonvolatile memory devices 300 which store data under the control of the memory controller 200.

The temperature sensor 120 senses the temperature of a Printed Circuit Board (PCB) 101a (see FIG. 6) or an inventive pattern to be described later and provides the sensing signal SS to the memory controller 200 when the temperature of the PCB 101 or the pattern reaches a predetermined temperature. The memory controller 200 may then turn on the nonvolatile memory devices 300 in response to the sensing signal SS.

The nonvolatile memory devices 300 may include vertical-NAND (V-NAND) flash memories having a two-dimensional (2D) or three-dimensional (3D) structure but may also include other types of nonvolatile memories such as phase change random access memories (PRAMs) and/or resistive random access memories (RRAMs).

The storage device 1010 may be included in the system 1000 in a state in which it is physically separated from the main processor 1100 or may be included in the system 1000 in a form in which it is mounted in the PCB 101a. Alternatively, the storage device 1010 may be implemented in the same package as the main processor 1100 or may be in the form of a memory card, and thus, may be detachably coupled to other components of the system 1000 through an interface such as the connecting interface 1480 which will be described later. The storage device 1010 may be, but is not necessarily limited to, a device to which a standard protocol such as universal flash storage (UFS) is applied.

The image capturing device 1410 may capture still images or moving images and may be a camera, a camcorder, and/or a webcam.

The user input device 1420 may receive various types of data from a user of the system 1000 and may be a touch pad, a keypad, a keyboard, a mouse and/or a microphone.

The sensor 1430 may detect various types of physical quantities that can be obtained from outside the system 1000 and may convert the detected physical quantities into electrical signals. The sensor 1430 may be a temperature sensor, a pressure sensor, an illuminance sensor, a position sensor, an acceleration sensor, a biosensor and/or a gyroscope.

The communication device 1440 may transmit and receive signals to and from other devices outside the system 1000 according to various communication protocols. The communication device 1440 may include an antenna, a transceiver, and/or a modem.

The display 1450 and the speaker 1460 may function as output devices that respectively output visual information and audio information to the user of the system 1000.

The power supplying device 1470 may convert power supplied from a battery embedded in the system 1000 and/or an external power source and supply the power to each component of the system 1000.

The connecting interface 1480 may provide a connection between the system 1000 and an external device which is connected to the system 1000 to exchange data with the system 1000.

The connecting interface 1480 may be implemented as various interfaces such as advanced technology attachment (ATA), serial-ATA (SATA), external SATA (e-SATA), small computer small interface (SCSI), serial attached SCSI (SAS), peripheral component interconnection (PCI), PCI express (PCe), nonvolatile memory (NVM) express (NVMe), IEEE 1394, universal serial bus (USB), secure digital (SD) card, multi-media card (MMC), embedded multi-media card (eMMC), universal flash storage (UFS), embedded universal flash storage (eUFS), and compact flash (CF) card interface. In particular, the PCB 101a described above may also be applied to the standard protocol of the connecting interface 1480.

Figure 2:
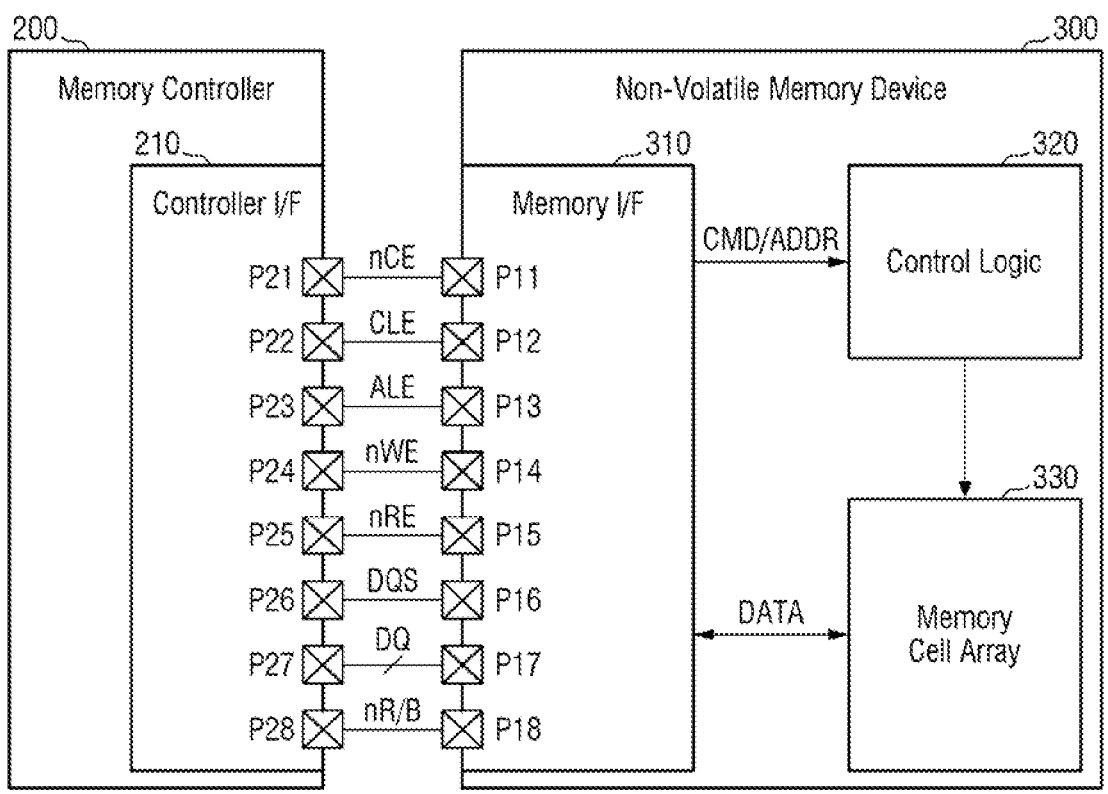
FIG. 2 is a block diagram of a storage system according to embodiments of the present disclosure.

FIG. 2 is a block diagram of a storage system 10 according to embodiments of the present disclosure. The storage system 10 may correspond to the storage device 1010 of FIG. 1.

Referring to FIG. 2, the storage system 10 may include a memory controller 200 and a nonvolatile memory device 300. The memory controller 200 and the nonvolatile memory device 300 may correspond to the memory controller 200 and one of the nonvolatile memory devices 300 of FIG. 1, respectively.

The nonvolatile memory device 300 may include first, second, third, fourth, fifth, sixth, seventh and eighth pins P11, P12, P13, P14, P15, P16, P17 and P18, a memory interface circuit 310, a control logic circuit 320, and a memory cell array 330.

The memory interface circuit 310 may receive a chip enable signal nCE from the memory controller 200 through the first pin P11. The memory interface circuit 310 may transmit and receive signals to and from the memory controller 200 through the second through eighth pins P12 through P18 according to the chip enable signal nCE. For example, when the chip enable signal nCE is enabled (e.g., at a low level), the memory interface circuit 310 may transmit and receive signals to and from the memory controller 200 through the second through eighth pins P12 through P18.

The memory interface circuit 310 may receive a command latch enable signal CLE, an address latch enable signal ALE, and a write enable signal nWE from the memory controller 200 through the second through fourth pins P12 through P14. The memory interface circuit 310 may receive a data signal DQ from the memory controller 200 or transmit the data signal DQ to the memory controller 200 through the seventh pin P17. A command CMD, an address ADDR, and data DATA may be transmitted through the data signal DQ. For example, the data signal DQ may be transmitted through a plurality of data signal lines. In this case, the seventh pin P17 may include a plurality of pins corresponding to a plurality of data signals.

The memory interface circuit 310 may obtain the command CMD from the data signal DQ received in an enable period (e.g., a high level state) of the command latch enable signal CLE based on toggle timings of the write enable signal nWE. The memory interface circuit 310 may obtain the address ADDR from the data signal DQ received in an enable period (e.g., a high level state) of the address latch enable signal ALE based on the toggle timings of the write enable signal nWE.

In an embodiment of the present disclosure, the write enable signal nWE may maintain a static state (e.g., a high level or a low level) and then toggle between a high level and a low level.

For example, the write enable signal nWE may toggle in a period in which the command CMD or the address ADDR is transmitted. Accordingly, the memory interface circuit 310 may obtain the command CMD or the address ADDR based on the toggle timings of the write enable signal nWE.

The memory interface circuit 310 may receive a read enable signal nRE from the memory controller 200 through the fifth pin P15. The memory interface circuit 310 may receive a data strobe signal DQS from the memory controller 200 or transmit the data strobe signal DQS to the memory controller 200 through the sixth pin P16.

In a data output operation of the nonvolatile memory device 300, the memory interface circuit 310 may receive the read enable signal nRE that toggles through the fifth pin P15 before outputting the data DATA. The memory interface circuit 310 may generate the data strobe signal DQS that toggles based on the toggling of the read enable signal nRE. For example, the memory interface circuit 310 may generate the data strobe signal DQS that starts to toggle after a predetermined delay (e.g., tDQSRE) from a toggling start time of the read enable signal nRE. The memory interface circuit 310 may transmit the data signal DQ including the data DATA based on the toggle timing of the data strobe signal DQS. Accordingly, the data DATA may be aligned with the toggle timing of the data strobe signal DQS and transmitted to the memory controller 200.

In a data input operation of the nonvolatile memory device 300, when the data signal DQ including the data DATA is received from the memory controller 200, the memory interface circuit 310 may receive the data strobe signal DQS that toggles from the memory controller 200 together with the data DATA. The memory interface circuit 310 may obtain the data DATA from the data signal DQ based on the toggle timing of the data strobe signal DQS. For example, the memory interface circuit 310 may obtain the data DATA by sampling the data signal DQ at a rising edge and a falling edge of the data strobe signal DQS.

The memory interface circuit 310 may transmit a ready/busy output signal nR/B to the memory controller 200 through the eighth pin P18. The memory interface circuit 310 may transmit state information of the nonvolatile memory device 300 to the memory controller 200 through the ready/busy output signal nR/B. When the nonvolatile memory device 300 is in a busy state (in other words, when internal operations of the nonvolatile memory device 300 are being performed), the memory interface circuit 310 may transmit the ready/busy output signal nR/B indicating the busy state to the memory controller 200. When the nonvolatile memory device 300 is in a ready state (in other words, when the internal operations of the nonvolatile memory device 300 are not performed or are completed), the memory interface circuit 310 may transmit the ready/busy output signal nR/B indicating the ready state to the memory controller 200. For example, while the nonvolatile memory device 300 reads the data DATA from the memory cell array 330 in response to a page read command, the memory interface circuit 310 may transmit the ready/busy output signal nR/B indicating the busy state (e.g., a low level) to the memory controller 200. For example, while the nonvolatile memory device 300 programs the data DATA into the memory cell array 330 in response to a program command, the memory interface circuit 310 may transmit the ready/busy output signal nR/B indicating the busy state to the memory controller 200.

The control logic circuit 320 may control various operations of the nonvolatile memory device 300. The control logic circuit 320 may receive the obtained command/address CMD/ADDR from the memory interface circuit 310. The control logic circuit 320 may generate control signals for controlling other components of the nonvolatile memory device 300 according to the received command/address CMD/ADDR. For example, the control logic circuit 320 may generate various control signals for programming the data DATA into the memory cell array 330 or reading the data DATA from the memory cell array 330.

The memory cell array 330 may store the data DATA obtained from the memory interface circuit 310 under the control of the control logic circuit 320. The memory cell array 330 may output the stored data DATA to the memory interface circuit 310 under the control of the control logic circuit 320.

The memory cell array 330 may include a plurality of memory cells. For example, the memory cells may be flash memory cells. However, the present disclosure is not limited thereto, and the memory cells may also be RRAM cells, ferroelectric random access memory (FRAM) cells, PRAM cells, thyristor random access memory (TRAM) cells, or magnetoresistive RAM (MRAM) cells. Embodiments of the present disclosure will be described below, focusing on an embodiment in which the memory cells are NAND flash memory cells.

The memory controller 200 may include first, second, third, fourth, fifth, sixth, seventh and eighth pins P21, P22, P23, P24, P25, P26, P27 and P28 and a controller interface circuit 210. The first through eighth pins P21 through P28 may correspond to the first through eighth pins P11 through P18 of the nonvolatile memory device 300.

The controller interface circuit 210 may transmit the chip enable signal nCE to the nonvolatile memory device 300 through the first pin P21. The controller interface circuit 210 may transmit and receive signals to and from the nonvolatile memory device 300, which is selected through the chip enable signal nCE, through the second through eighth pins P22 through P28.

The controller interface circuit 210 may transmit the command latch enable signal CLE, the address latch enable signal ALE, and the write enable signal nWE to the nonvolatile memory device 300 through the second through fourth pins P22 through P24. The controller interface circuit 210 may transmit the data signal DQ to the nonvolatile memory device 300 or receive the data signal DQ from the nonvolatile memory device 300 through the seventh pin P27.

The controller interface circuit 210 may transmit the data signal DQ including the command CMD or the address ADDR to the nonvolatile memory device 300 together with the write enable signal nWE that toggles. The controller interface circuit 210 may transmit the data signal DQ including the command CMD to the nonvolatile memory device 300 by transmitting the enabled command latch enable signal CLE and may transmit the data signal DQ including the address ADDR to the nonvolatile memory device 300 by transmitting the enabled address latch enable signal ALE.

The controller interface circuit 210 may transmit the read enable signal nRE to the nonvolatile memory device 300 through the fifth pin P25. The controller interface circuit 210 may receive the data strobe signal DQS from the nonvolatile memory device 300 or transmit the data strobe signal DQS to the nonvolatile memory device 300 through the sixth pin P26.

In a data output operation of the nonvolatile memory device 300, the controller interface circuit 210 may generate the read enable signal nRE that toggles and transmit the read enable signal nRE to the nonvolatile memory device 300. For example, the controller interface circuit 210 may generate the read enable signal nRE that changes from a static state (e.g., a high level or a low level) to a toggle state before the data DATA is output. Accordingly, the data strobe signal DQS that toggles based on the read enable signal nRE may be generated in the nonvolatile memory device 300. The controller interface circuit 210 may receive the data signal DQ including the data DATA from the nonvolatile memory device 300, together with the toggling data strobe signal DQS. The controller interface circuit 210 may obtain the data DATA from the data signal DQ based on the toggle timing of the data strobe signal DQS.

In a data input operation of the nonvolatile memory device 300, the controller interface circuit 210 may generate the data strobe signal DQS that toggles. For example, the controller interface circuit 210 may generate the data strobe signal DQS that changes from a static state (e.g., a high level or a low level) to a toggle state before transmitting the data DATA. The controller interface circuit 210 may transmit the data signal DQ including the data DATA to the nonvolatile memory device 300 based on the toggle timings of the data strobe signal DQS.

The controller interface circuit 210 may receive the ready/busy output signal nR/B from the nonvolatile memory device 300 through the eighth pin P28. The controller interface circuit 210 may determine state information of the nonvolatile memory device 300 based on the ready/busy output signal nR/B.

Figure 3:
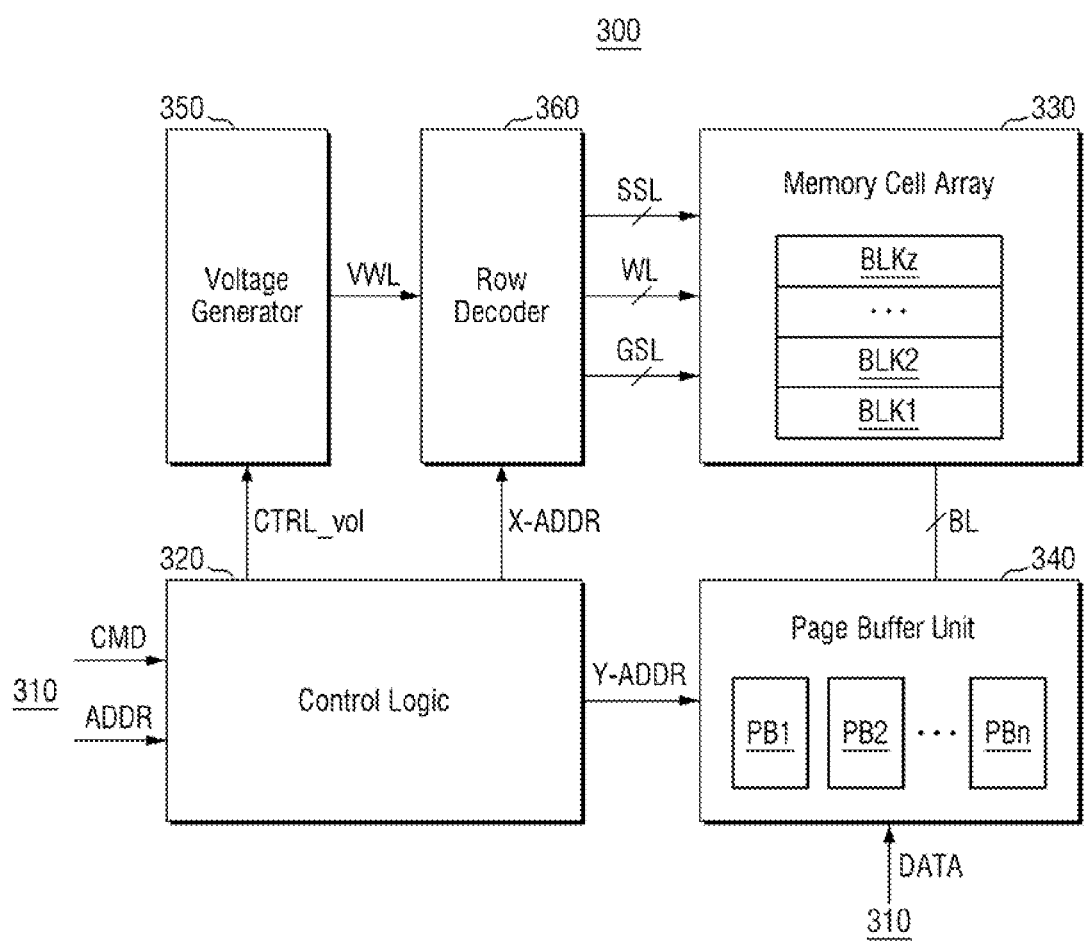
FIG. 3 illustrates a nonvolatile memory device of FIG. 2.

FIG. 3 illustrates the nonvolatile memory device 300 of FIG. 2.

FIG. 3 is an example block diagram of the nonvolatile memory device 300 of FIG. 2. Referring to FIG. 3, the nonvolatile memory device 300 may include the control logic circuit 320, the memory cell array 330, a page buffer unit 340, a voltage generator 350, and a row decoder 360. The nonvolatile memory device 300 may further include the memory interface circuit 310 illustrated in FIG. 2 and may further include a column logic, a pre-decoder, a temperature sensor, a command decoder, an address decoder, and the like.

The control logic circuit 320 may control various operations in the nonvolatile memory device 300. The control logic circuit 320 may output various control signals in response to the command CMD and/or the address ADDR from the memory interface circuit 310. For example, the control logic circuit 320 may output a voltage control signal CTRL_vol, a row address X-ADDR, and a column address Y-ADDR.

The memory cell array 330 may include a plurality of memory blocks BLK1 through BLKz (where r is a positive integer), and each of the memory blocks BLK1 through BLKz may include a plurality of memory cells. The memory cell array 330 may be connected to the page buffer unit 340 through bit lines BL and may be connected to the row decoder 360 through word lines WL, string select lines SSL and ground select lines GSL.

In an embodiment of the present disclosure, the memory cell array 330 may include a 3D memory cell array, and the 3D memory cell array may include a plurality of NAND strings. Each of the NAND strings may include memory cells respectively connected to word lines stacked vertically on a substrate. U.S. Pat. Nos. 7,679,133, 8,553,466, 8,654, 587, and 8,559,235, and U.S. Patent Application Publication No. 2011/0233648 are incorporated by reference herein in their entireties. In an embodiment of the present disclosure, the memory cell array 330 may include a 2D memory cell array, and the 2D memory cell array may include a plurality of NAND strings disposed along row and column directions.

The page buffer unit 340 may include a plurality of page buffers PB1 through PBn (where n is an integer of 3 or more), and the page buffers PB1 through PBn may be connected to the memory cells through the bit lines BL, respectively. The page buffer unit 340 may select at least one of the bit lines BL in response to the column address Y-ADDR. The page buffer unit 340 may operate as a write driver or a sense amplifier according to an operating mode. For example, during a program operation, the page buffer unit 340 may apply a bit line voltage corresponding to data to be programmed to a selected bit line. During a read operation, the page buffer unit 340 may sense data stored in a memory cell by sensing a current or voltage of a selected bit line.

The voltage generator 350 may generate various types of voltages for performing program, read, and erase operations based on the voltage control signal CTRL_vol. For example, the voltage generator 350 may generate a program voltage, a read voltage, a program verify voltage, an erase voltage, or the like as a word line voltage VW L.

The row decoder 360 may select one of the word lines WL and select one of the string select lines SSL in response to the row address X-ADDR. For example, during a program operation, the row decoder 360 may apply a program voltage and a program verify voltage to a selected word line. During a read operation, the row decoder 360 may receive the read enable signal nRE and provide the data signal DQ and the data strobe signal DQS to the memory interface circuit 310 by applying a read voltage to a selected word line.

Figure 4:
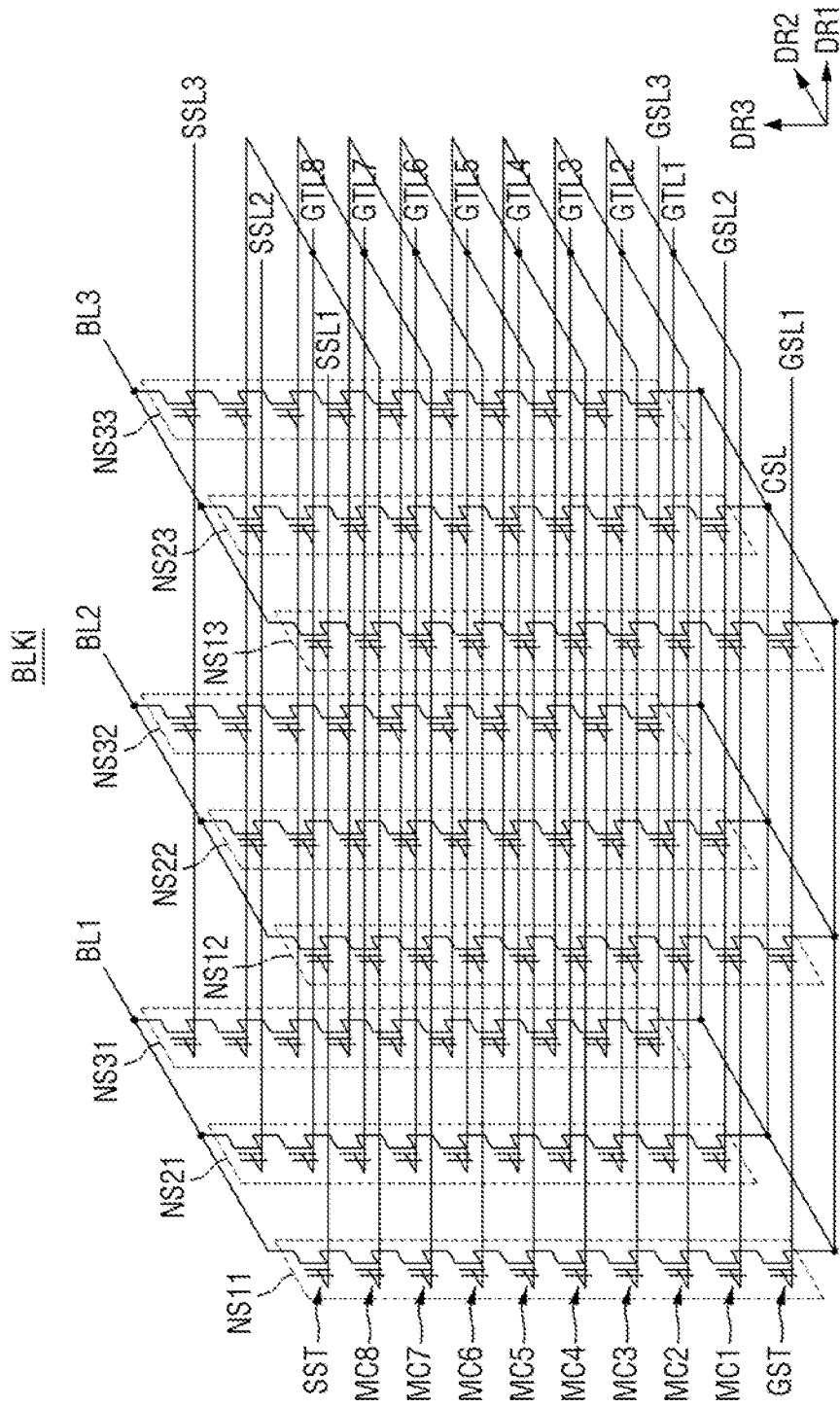
FIG. 4 illustrates a three-dimensional (3D) vertical-NAND (V-NAND) structure that can be included in a nonvolatile memory device according to embodiments of the present disclosure.

FIG. 4 illustrates a 3D V-NAND structure that can be included in a nonvolatile memory device 300 according to embodiments of the present disclosure. When the nonvolatile memory device 300 is implemented as a 3D V-NAND type flash memory, each of a plurality of memory blocks constituting a memory cell array 330 can be expressed as an equivalent circuit as illustrated in FIG. 4.

A memory block BLKi illustrated in FIG. 4 is a 3D memory block formed in a 3D structure on a substrate. For example, a plurality of memory NAND strings included in the memory block BLKi may be formed in a direction perpendicular to the substrate.

Referring to FIG. 4, the memory block BLKi may include a plurality of memory NAND strings NS11, NS12, NS13, NS21, NS22, NS23, NS31, NS32 and NS33 connected between bit lines BL1, BL2 and BL3 and a common source line CSL. Each of the memory NAND strings NS11 through NS33 may include a string select transistor SST, a plurality of memory cells MC1, MC2, MC3, MC4, MC5, MC6, MC7 and MC8, and a ground select transistor GST. Although each of the memory NAND strings NS11 through NS33 includes eight memory cells MC1 through MC8 in FIG. 4, the present disclosure is not necessarily limited thereto. For example, each of the memory NAND strings NS11 through NS33 may include fewer or more than eight memory cells.

The string select transistor SST may be connected to a corresponding string select line SSL1, SSL2 or SSL3. The memory cells MC1 through MC8 may be connected to corresponding gate lines GTL1, GTL2, GTL3, GTL4, GTL5, GTL6, GTL7 and GTL8, respectively. The gate lines GTL1 through GTL8 may be word lines, and some of the gate lines GTL1 through GTL8 may be dummy word lines. The ground select transistor GST may be connected to a corresponding ground select line GSL1, GSL2 or GSL3. The string select transistor SST may be connected to a corresponding bit line BL1, BL2 or BL3, and the ground select transistor GST may be connected to the common source line CSL.

A word line (e.g., WL1) at the same height (as memory cells (e.g., MC1)) may be connected in common (to the memory cells (e.g., MC1)), and the ground select lines GSL1 through GSL3 and the string select lines SSL1 through SSL3 may be separated from each other. Although the memory block BLKi is connected to eight gate lines GTL1 through GTL8 and three bit lines BL1 through BL3 in FIG. 4, the present disclosure is not necessarily limited thereto.

Figure 5:
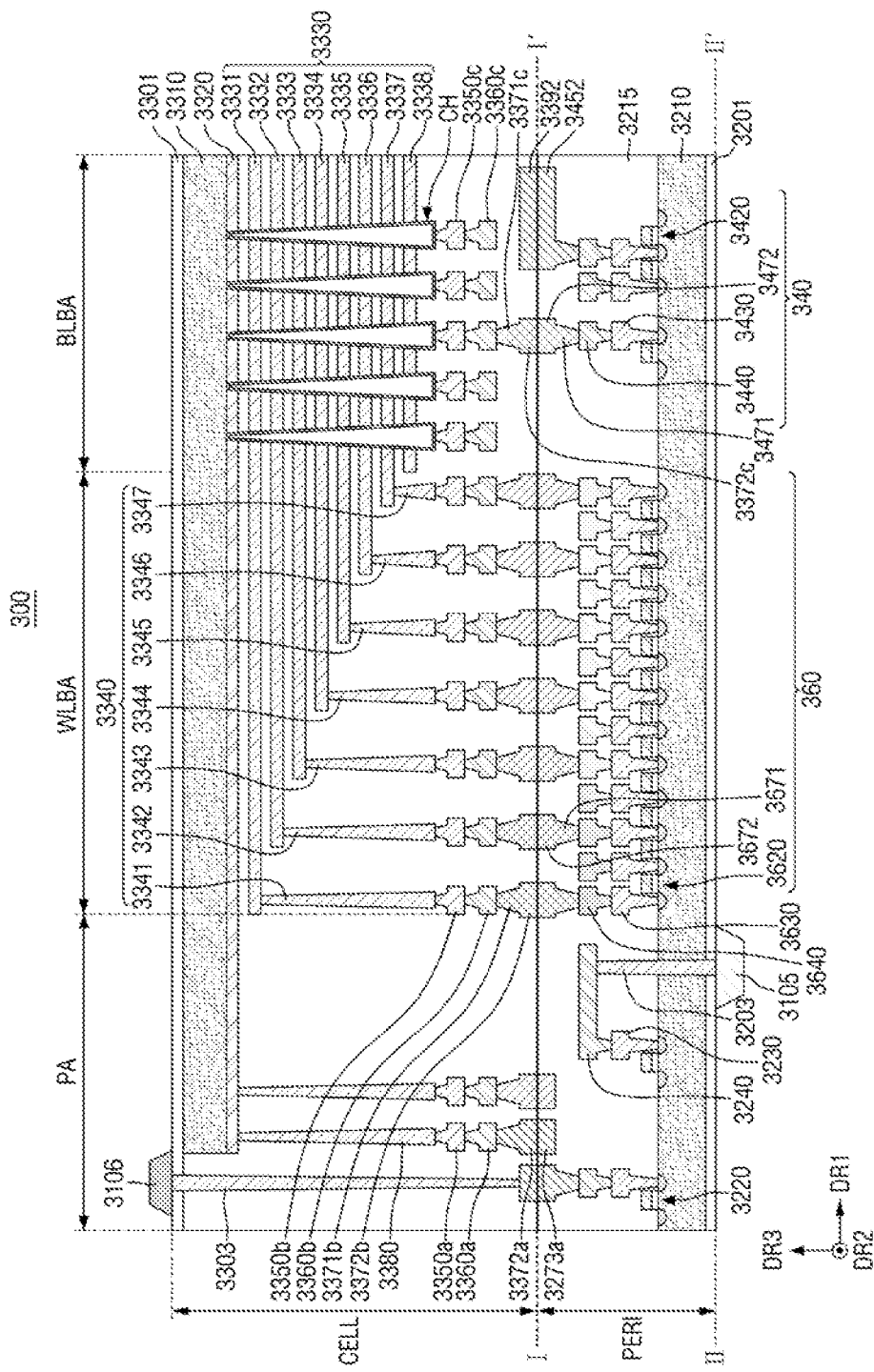
FIG. 5 illustrates a BVNAND structure applicable to a nonvolatile memory device according to embodiments of the present disclosure.

FIG. 5 illustrates a BVNAND structure applicable to a nonvolatile memory device 300 according to embodiments of the present disclosure. Referring to FIG. 5, the nonvolatile memory device 300 may have a chip-to-chip (C2C) structure. The C2C structure may be formed by manufacturing an upper chip including a cell area CELL on a first wafer, manufacturing a lower chip including a peripheral circuit area PERI on a second wafer different from the first wafer, and then connecting the upper chip and the lower chip to each other using a bonding method. For example, the bonding method may refer to a method of electrically connecting a bonding metal formed on an uppermost metal layer of the upper chip and a bonding metal formed on an uppermost metal layer of the lower chip. For example, when the bonding metals are made of copper (Cu), the bonding method may be a Cu—Cu bonding method. The bonding metals may also be made of aluminum or tungsten.

Each of the peripheral circuit area PERI and the cell area CELL of the nonvolatile memory device 300 may include an external pad bonding area PA, a word line bonding area WLBA, and a bit line bonding area BLBA.

The peripheral circuit area PERI may include a first substrate 3210, an interlayer insulating layer 3215, a plurality of circuit elements 3220, 3620 and 3420 formed on the first substrate 3210, first metal layers 3230, 3630 and 3430 respectively connected to the circuit elements 3220, 3620 and 3420, and second metal layers 3240, 3640 and 3440 formed on the first metal layers 3230, 3630 and 3430. In an embodiment of the present disclosure, the first metal layers 3230, 3630 and 3430 may be made of tungsten having a relatively high resistance, and the second metal layers 3240, 3640 and 3440 may be made of copper having a relatively low resistance.

Although only the first metal layers 3230, 3630 and 3430 and the second metal layers 3240, 3640 and 3440 are illustrated and described herein, the present disclosure is not limited thereto, and one or more metal layers may also be further formed on the second metal layers 3240, 3640 and 3440. At least some of the metal layers formed on the second metal layers 3240, 3640 and 3440 may be made of aluminum having a lower resistance than copper that forms the second metal layers 3240, 3640 and 3440.

The interlayer insulating layer 3215 may be disposed on the first substrate 3210 to cover the circuit elements 3220, 3620 and 3420, the first metal layers 3230, 3630 and 3430 and the second metal layers 3240, 3640 and 3440 and may include an insulating material such as silicon oxide or silicon nitride.

Lower bonding metals 3671 and 3672 may be formed on the second metal layers 3640 of the word line bonding area WLBA. In the word line bonding area WLBA, the lower bonding metals 3671 and 3672 of the peripheral circuit area PERI may be electrically connected to upper bonding metals 3371b and 3372b of the cell area CELL by a bonding method, and the lower bonding metals 3671 and 3672 and the upper bonding metals 3371b and 3372b may be made of aluminum, copper or tungsten.

The cell area CELL may provide at least one memory block. The cell area CELL may include a second substrate 3310 and a common source line 3320. A plurality of word lines 3331, 3332, 3333, 3334, 3335, 3336, 3337 and 3338 (3330) may be stacked on the second substrate 3310 along a direction (Z-axis direction) perpendicular to an upper surface of the second substrate 3310. String select lines and a ground select line may be disposed on and under the word lines 3330, respectively, and the word lines 3330 may be disposed between the string select lines and the ground select line.

In the bit line bonding area BLBA, channel structures CH may extend in the direction perpendicular to the upper surface of the second substrate 3310 to penetrate the word lines 3330, the string select lines, and the ground select line. Each of the channel structures CH may include a data storage layer, a channel layer and a buried insulating layer, and the channel layer may be electrically connected to a first metal layer 3350c and a second metal layer 3360c. For example, the first metal layer 3350c may be a bit line contact, and the second metal layer 3360c may be a bit line. In an embodiment of the present disclosure, the bit line 3360c may extend along a first direction (Y-axis direction) parallel to the upper surface of the second substrate 3310.

In the embodiment illustrated in FIG. 5, an area where the channel structures CH and the bit lines 3360c are disposed may be referred to as the bit line bonding area BLBA. In the bit line bonding area BLBA, one of the bit lines 3360c may be electrically connected to the circuit elements 3420 which provide a page buffer 340 in the peripheral circuit area PERI. For example, one of the bit lines 3360c may be connected to upper bonding metals 3371c and 3372c in the peripheral circuit area PERI, and the upper bonding metals 3371c and 3372c may be connected to lower bonding metals 3471 and 3472 connected to the circuit elements 3420 of the page buffer 340.

In the word line bonding area WLBA, the word lines 3330 may extend along a second direction (X-axis direction) parallel to the upper surface of the second substrate 3310 and may be connected to a plurality of cell contact plugs 3341, 3342, 3343, 3344, 3345, 3346 and 3347 (3340). The word lines 3330 and the cell contact plugs 3340 may be connected to each other by pads provided by at least some of the word lines 3330 which extend to different lengths along the second direction. First metal layers 3350b and second metal layers 3360b may be sequentially connected onto the cell contact plugs 3340 connected to the word lines 3330. In the word line bonding area WLBA, the cell contact plugs 3340 may be connected to the peripheral circuit area PERI through the upper bonding metals 3371b and 3372b of the cell area CELL and the lower bonding metals 3671 and 3672 of the peripheral circuit area PERI.

The cell contact plugs 3340 may be electrically connected to the circuit elements 3620 which provide a row decoder 360 in the peripheral circuit area PERI. In an embodiment of the present disclosure, an operating voltage of the circuit elements 3620 which provide the row decoder 360 may be different from an operating voltage of the circuit elements 3420 which provide the page buffer 340. For example, the operating voltage of the circuit elements 3420 which provide the page buffer 340 may be greater than the operating voltage of the circuit elements 3620 which provide the row decoder 360.

Common source line contact plugs 3380 may be disposed in the external pad bonding area PA. The common source line contact plugs 3380 may be made of a conductive material such as a metal, a metal compound or polysilicon and may be electrically connected to the common source line 3320. First metal layers 3350a and second metal layers 3360a may be sequentially stacked on the common source line contact plugs 3380. For example, an area where the common source line contact plugs 3380, the first metal layers 3350a, and the second metal layers 3360a are disposed may be referred to as the external pad bonding area PA.

Input/output pads 3105 and 3106 may be disposed in the external pad bonding area PA. Referring to FIG. 5, a lower insulating layer 3201 may be formed under the first substrate 3210 to cover a lower surface of the first substrate 3210, and a first input/output pad 3105 may be formed on the lower insulating layer 3201. The first input/output pad 3105 may be connected to at least one of the circuit elements 3220, 3620 and 3420 disposed in the peripheral circuit area PERI through a first input/output contact plug 3203 and may be separated from the first substrate 3210 by the lower insulating layer 3201. In addition, a side insulating layer may be disposed between the first input/output contact plug 3203 and the first substrate 3210 to electrically separate the first input/output contact plug 3203 and the first substrate 3210.

Referring to FIG. 5, an upper insulating layer 3301 may be formed on the second substrate 3310 to cover the upper surface of the second substrate 3310, and a second input/output pad 3106 may be disposed on the upper insulating layer 3301. The second input/output pad 3106 may be connected to at least one of the circuit elements 3220, 3420 and 3620 disposed in the peripheral circuit area PERI through a second input/output contact plug 3303.

According to embodiments of the present disclosure, the second substrate 3310 and the common source line 3320 may not be disposed in an area where the second input/output contact plug 3303 is disposed. In addition, the second input/output pad 3106 may not overlap the word lines 3330 in a third direction (Z-axis direction). Referring to FIG. 5, the second input/output contact plug 3303 may be separated from the second substrate 3310 in a direction parallel to the upper surface of the second substrate 3310 and may penetrate the interlayer insulating layer 3215 of the cell area CELL and may be connected to the second input/output pad 3106.

According to embodiments of the present disclosure, the first input/output pad 3105 and the second input/output pad 3106 may be selectively formed. For example, the nonvolatile memory device 300 may include only the first input/output pad 3105 disposed on the first substrate 3210 or may include only the second input/output pad 3106 disposed on the second substrate 3310. Alternatively, the nonvolatile memory device 300 may include both the first input/output pad 3105 and the second input/output pad 3106.

In each of the external pad bonding area PA and the bit line bonding area BLBA included in each of the cell area CELL and the peripheral circuit area PERI, a metal pattern of an uppermost metal layer may exist as a dummy pattern, or the uppermost metal layer may be empty.

In the external pad bonding area PA of the nonvolatile memory device 300, lower metal patterns 3273a having the same shape as upper metal patterns 3372a of the cell area CELL may be formed in an uppermost metal layer of the peripheral circuit area PERI to correspond to the upper metal patterns 3372a formed in an uppermost metal layer of the cell area CELL. The lower metal patterns 3273a formed in the uppermost metal layer of the peripheral circuit area PERI may not be connected to separate contacts in the peripheral circuit area PERI. In the external pad bonding area PA, upper metal patterns having the same shape as lower metal patterns of the peripheral circuit area PERI may be formed in the uppermost metal layer of the cell area CELL to correspond to the lower metal patterns formed in the uppermost metal layer of the peripheral circuit area PERI.

The lower bonding metals 3671 and 3672 may be formed on the second metal layers 3640 of the word line bonding area WLBA. In the word line bonding area WLBA, the lower bonding metals 3671 and 3672 of the peripheral circuit area PERI may be electrically connected to the upper bonding metals 3371b and 3372b of the cell area CELL by a bonding method.

In addition, in the bit line bonding area BLBA, an upper metal pattern 3392 having the same shape as a lower metal pattern 3452 of the peripheral circuit area PERI may be formed in the uppermost metal layer of the cell area CELL to correspond to the lower metal pattern 3452 formed in the uppermost metal layer of the peripheral circuit area PERI. A contact may not be formed on the upper metal pattern 3392 formed in the uppermost metal layer of the cell area CELL.

Figure 6:
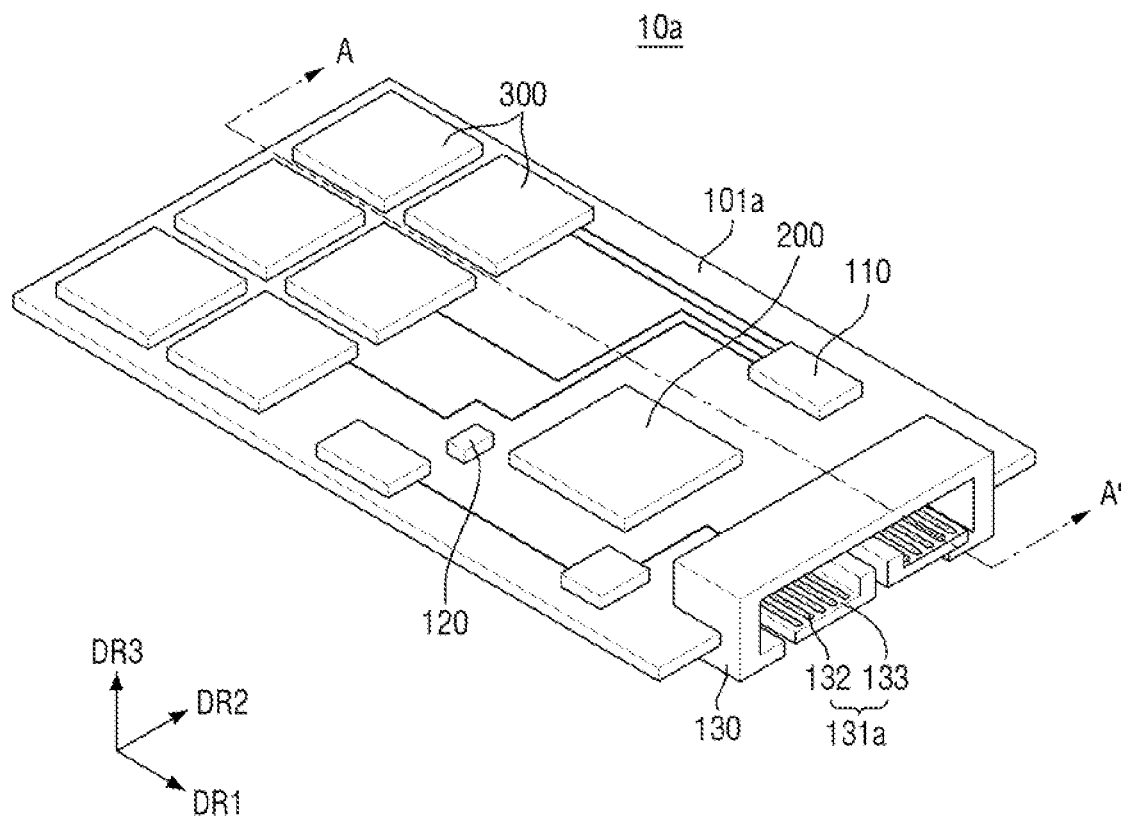
FIG. 6 is a perspective view of a storage system according to embodiments of the present disclosure.
Figure 7:
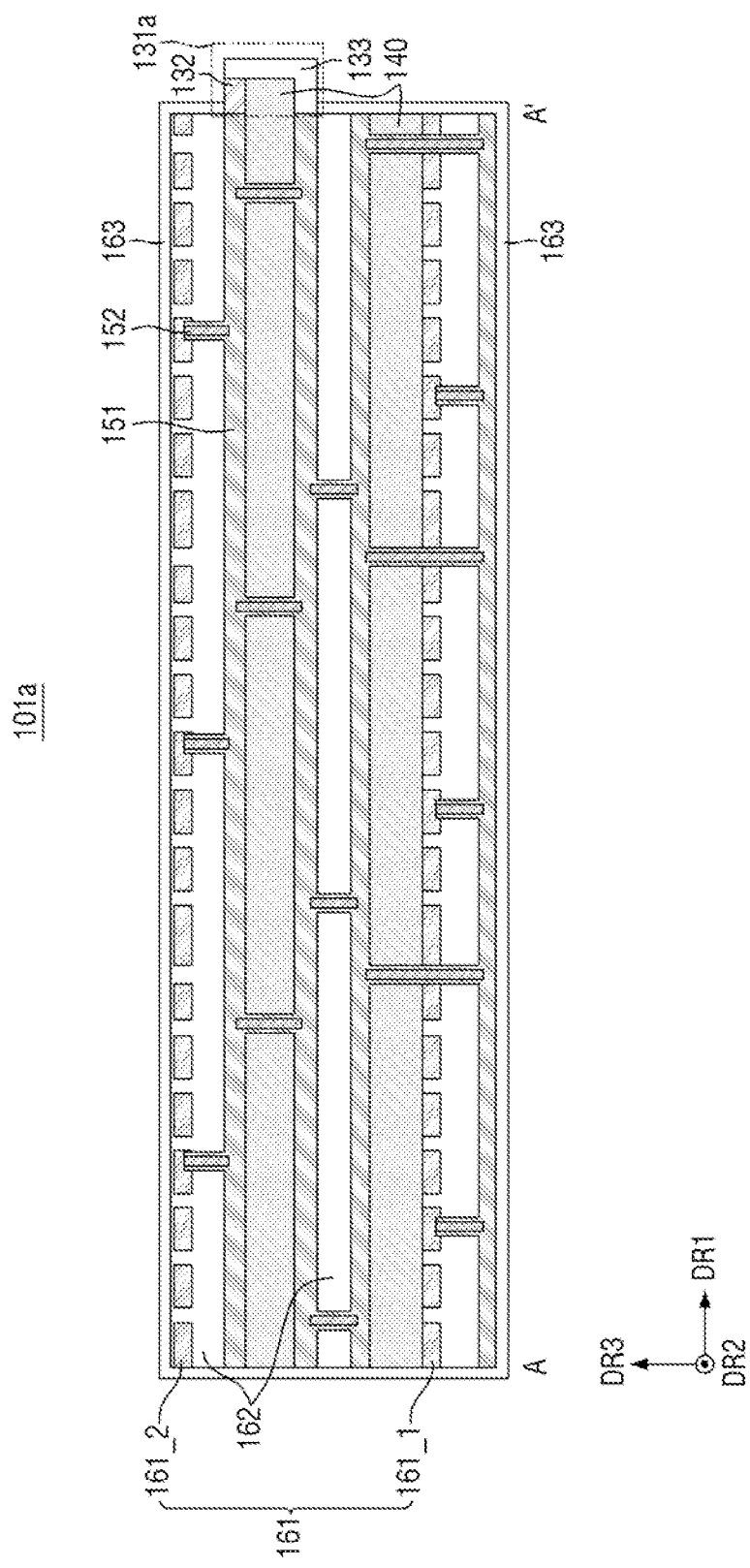
FIG. 7 is a cross-sectional view of a Printed Circuit Board (PCB) of FIG. 6, taken along line A-A'.

FIG. 6 is a perspective view of a storage system 10a according to embodiments of the present disclosure. FIG. 7 is a cross-sectional view of a PCB 101a of FIG. 6, taken along line A-A'. FIG. 6 illustrates an embodiment in which the storage device 1010 of FIG. 1 and the storage system 10 of FIG. 2 are mounted on the PCB 101a.

Referring to FIGS. 6 and 7, the storage system 10a may include the PCB 101a and a volatile memory 110, a temperature sensor 120, a memory controller 200 and a nonvolatile memory device 300 mounted on the PCB 101a.

The PCB 101a may be a rigid printed circuit board (RPCB) or a flexible printed circuit board (FPCB). The PCB 101a may receive power from an external power source, receive an electrical signal from the outside by exchanging data with an external host, and provide the electrical signal to the memory controller 200.

The PCB 101a may include a connector 130, a core layer 140, a conductive layer 151, vias 152, a heating pattern 161, an insulating adhesive layer 162, and a protective layer 163.

The connector 130 may provide an electrical signal received from the outside to other components included in the PCB 101a. The connector 130 may include a plurality of pins 131a protruding in a first direction DR1, and each of the pins 131a may include the core layer 140 protruding in the first direction DR1 and a negative thermal coefficient (NTC) thermistor 132 and a protective layer 133 disposed on a part of a protruding part of the core layer 140.

The electrical resistance of the NTC thermistor 132 varies according to a negative thermal coefficient. In other words, the NTC thermistor 132 has a negative thermal coefficient of resistance α, and thus, its electrical resistance decreases as the temperature increases.

The NTC thermistor 132 according to embodiments of the present disclosure may have a thermal coefficient of resistance α that is close to zero when a specific critical temperature is reached and may function as a polyswitch by providing power to other components included in the PCB 101a with a constant electrical resistance.

The critical temperature of the NTC thermistor 132 according to the embodiments of the present disclosure may be in the range of −5 to 25° C., which may be directly connected to the driving temperature of the nonvolatile memory device 300.

The NTC thermistor 132 may include, but is not limited to, $Mn_2O_3$, $NiO$, $Co_2O_3$, $Fe_2O_3$, $Cu_2O_3$, $Al_2O_3$, or a combination of these materials.

The NTC thermistor 132 may contact the conductive layer 151 to be described later and provide an electrical signal received from the outside to the conductive layer 151. Although the NTC thermistor 132 is disposed only in the connector 130 in FIGS. 6 and 7, it may be included as part of the conductive layer 151. An external electrical signal may be input to the PCB 101a through the NTC thermistor 132.

The core layer 140 may include one core layer or a plurality of core layers depending on the type of core structure of the PCB 101a. The core layer 140 may be referred to as a substrate, may include glass fiber and resin, and may be flame retardant (FR) 4 which is an insulator, kapton, epoxy resin, phenolic resin, or the like. However, the present disclosure is not limited to the above materials.

The protective layer 133 may be disposed on a part of the protruding part of the core layer 140 and may cover the protruding part of the core layer 140 on which the NTC thermistor 132 is not disposed. For example, the protective layer 133 may cover an end of the core layer 140 or a bottom portion of the core layer 140 where the NTC thermistor 132 is not arranged. The protective layer 133 may include the same material as the protective layer 163 to be described later.

Although the connector 130 includes protruding pins in FIGS. 6 and 7, the present disclosure is not limited thereto, and the PCB 101a may be electrically connected to an external chip or module through the connector 130. The conductive layer 151 may be coated on an upper surface or a lower surface of the core layer 140 and, depending on embodiments of the present disclosure, may be disposed on both the upper and lower surfaces of the core layer 140 or on one side of the core layer 140. The conductive layer 151 may include copper or the same materials as the NTC thermistor 132, but the present disclosure is not limited to the above materials. The conductive layer 151 may provide an electrical signal input or output through the connector 130 to other components mounted on the PCB 101a or other components disposed in the PCB 101a.

The insulating adhesive layer 162 may contact the core layer 140 coated with the conductive layer 151, the heating pattern 161 and the protective layer 163 and may bond the core layer 140, the heating pattern 161 and the protective layer 163 together.

The insulating adhesive layer 162 may be a prepreg resin which is a resin made into a semi-cured state by infiltrating a thermosetting resin into a glass fiber and may be formed in the form of a single layer. The insulating adhesive layer 162 is not limited to the prepreg resin and may be made of various other resins.

The heating pattern 161 may be disposed in the insulating adhesive layer 162, and specific shapes of the heating pattern 161 will be described later in the description of FIGS. 8 through 12.

The heating pattern 161 may include a first heating pattern layer 161_1 and a second heating pattern layer 161_2 spaced apart in a third direction DR3, and the second heating pattern layer 161_2 may be disposed adjacent to the memory controller 200 and the nonvolatile memory device 300 in the third direction DR3. At least a part of the second heating pattern layer 1612 may overlap the first heating pattern layer 161_1 in the third direction DR3. The number of layers may vary depending on embodiments of the present disclosure.

The heating pattern 161 according to embodiments of the present disclosure is a positive thermal coefficient (PTC) thermistor, and the electrical resistance of the heating pattern 161 varies according to a positive thermal coefficient. In other words, the heating pattern 161 has a positive thermal coefficient of resistance α, and thus, its electrical resistance increases as the temperature increases.

Since the thermal coefficient of resistance α of the heating pattern 161 according to the embodiments of the present disclosure increases when a specific critical temperature is reached, the heating pattern 161 generates heat before the critical temperature is reached and does not generate heat after the critical temperature is reached because no electricity flows.

The critical temperature of the heating pattern 161 according to the embodiments of the present disclosure may be in the range of −5 to 25° C., which may be directly connected to the driving temperature of the nonvolatile memory device 300.

The heating pattern 161 may include, but is not limited to, a combination of $BaTiO_3$ and Sr or Pb as a dielectric ceramic material or may include a polymer-based material.

The protective layer 163 may be referred to as a solder mask, may have insulating properties, and may be disposed on the conductive layer 151 and the insulating adhesive layer 162 to prevent oxidation and corrosion of the conductive layer 151 and the heating pattern 161. A part of the protective layer 163 may be exposed to form a pad, and the pad may be connected to the conductive layer 151 through a via 152 to be described later to provide an electrical signal to other components mounted on the PCB 101a.

Each of the vias 152 may penetrate the core layer 140 or the insulating adhesive layer 162 to connect a plurality of conductive layers 151 or connect the conductive layer 151 and the heating pattern 161.

The volatile memory device 110 may be, for example, a DRAM. The volatile memory device 110 may serve as a buffer in data exchange between the nonvolatile memory device 300 and the memory controller 200.

The temperature sensor 120 may be mounted on the PCB 101a. The temperature sensor 120 may sense the temperature of the PCB 101a or the temperature of the heating pattern 161 and provide a separate sensing signal SS (see FIG. 1) to the memory controller 200 when the temperature of the PCB 101a reaches a predetermined temperature or when the temperature of the heating pattern 161 reaches a critical temperature.

According to an embodiment of the present disclosure, the temperature sensor 120 may be embedded in the PCB 101a.

The memory controller 200 may be mounted on the PCB 101a, may receive an external electrical signal or power input through the connector 130, and may turn on the nonvolatile memory device 300 in response to the sensing signal SS.

The nonvolatile memory device 300 may be provided in plural numbers. The nonvolatile memory devices 300 may be arranged along the first direction DR1 and a second direction DR2, and data may be written to or read from the nonvolatile memory devices 300 at the request of the memory controller 200.

FIGS. 8 through 12 are plan views illustrating various arrangements of beating patterns according to embodiments of the present disclosure.

Figure 8:
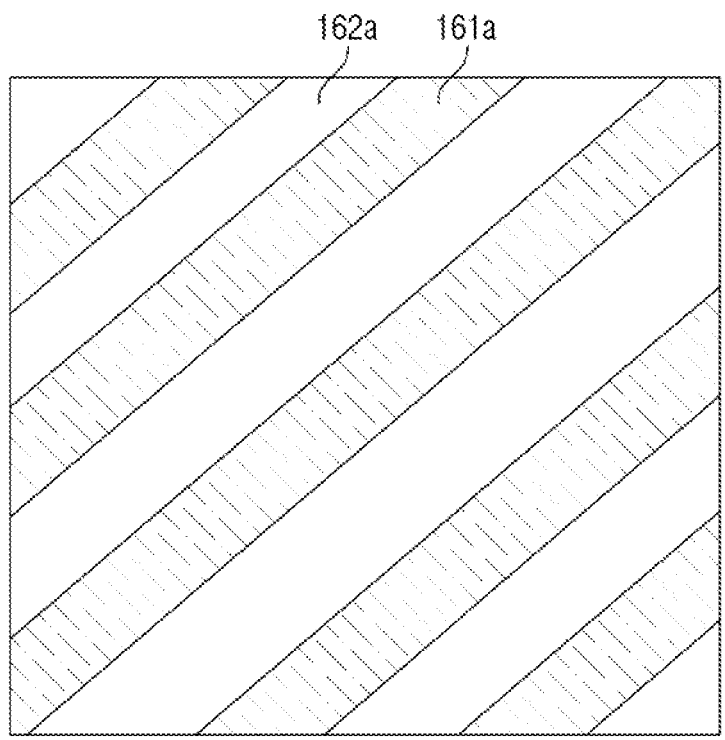
FIGS. 8, 9, 10, 11 and 12 are plan views illustrating various arrangements of heating patterns according to embodiments of the present disclosure.
Figure 8:
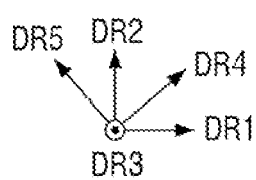

Referring to FIG. 8, a heating pattern 161a according to embodiments of the present disclosure may include a plurality of patterns extending in a fourth direction DR4 diagonal to the first direction DR1 and the second direction DR2. The heating pattern 161a may be disposed between insulating adhesive layers 162a extending in the fourth direction DR4.

Figure 9:
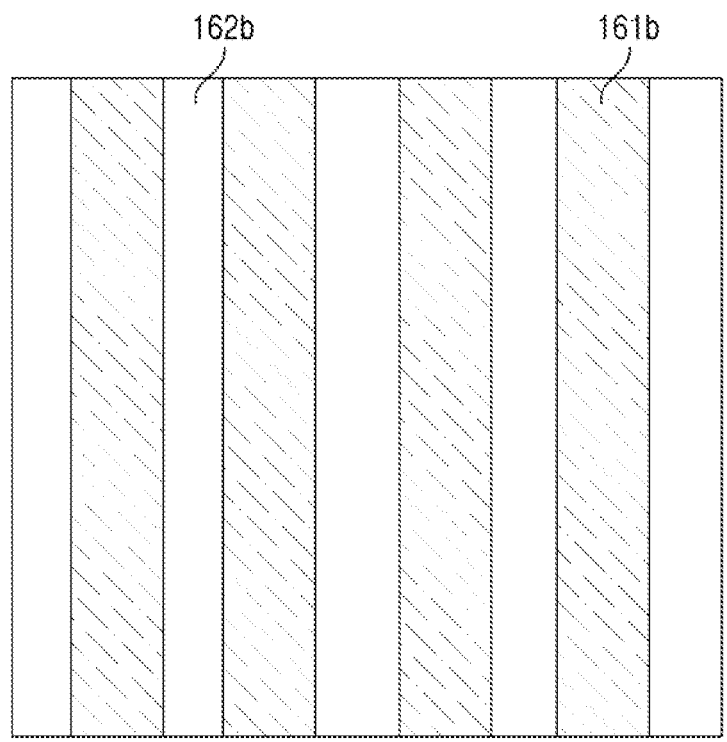
Figure 9:
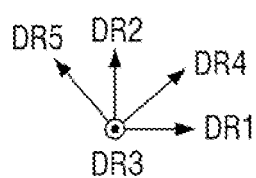

Referring to FIG. 9, a heating pattern 161b according to embodiments of the present disclosure may include a plurality of patterns extending in the second direction DR2. The heating pattern 161b may be disposed between insulating adhesive layers 162b extending in the fourth direction DR4.

Figure 10:
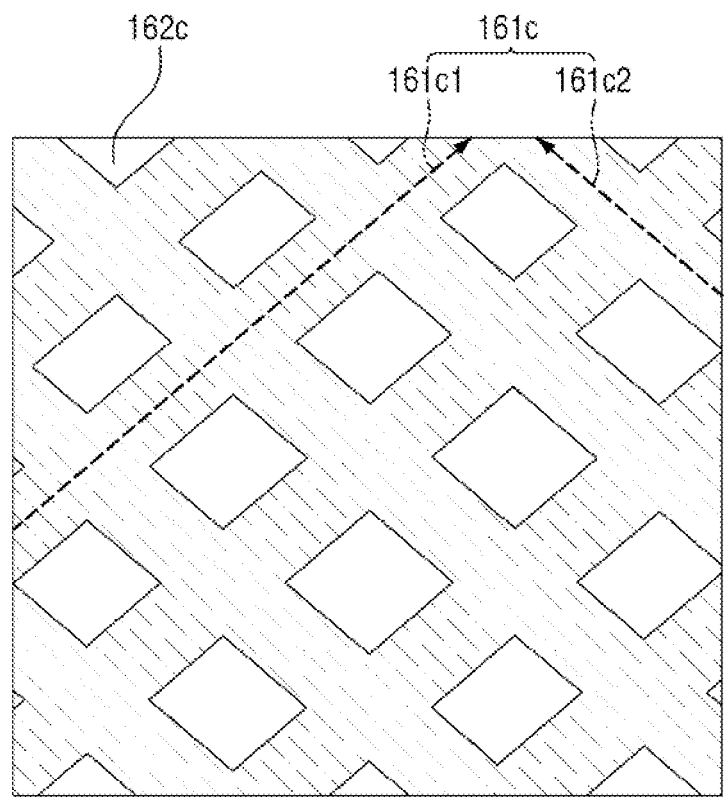
Figure 10:
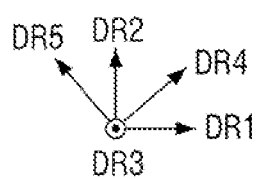

Referring to FIG. 10, a heating pattern 161c according to embodiments of the present disclosure may include a plurality of first heating patterns 161c1 extending in the fourth direction DR4 diagonal to the first direction DR1 and the second direction DR2 and a plurality of second heating patterns 161c2 extending in a fifth direction DR5 which is a diagonal direction different from the fourth direction DR4.

The first heating patterns 161c1 and the second heating patterns 161c2 may cross each other, and an insulating adhesive layer 162c may be disposed in a rhombus shape in a plan view between parts of the heating pattern 161c. In other words, the insulating adhesive layer 162c may be disposed at intersections of the first heating patterns 161c1 and the second heating patterns 161c2.

Figure 11:
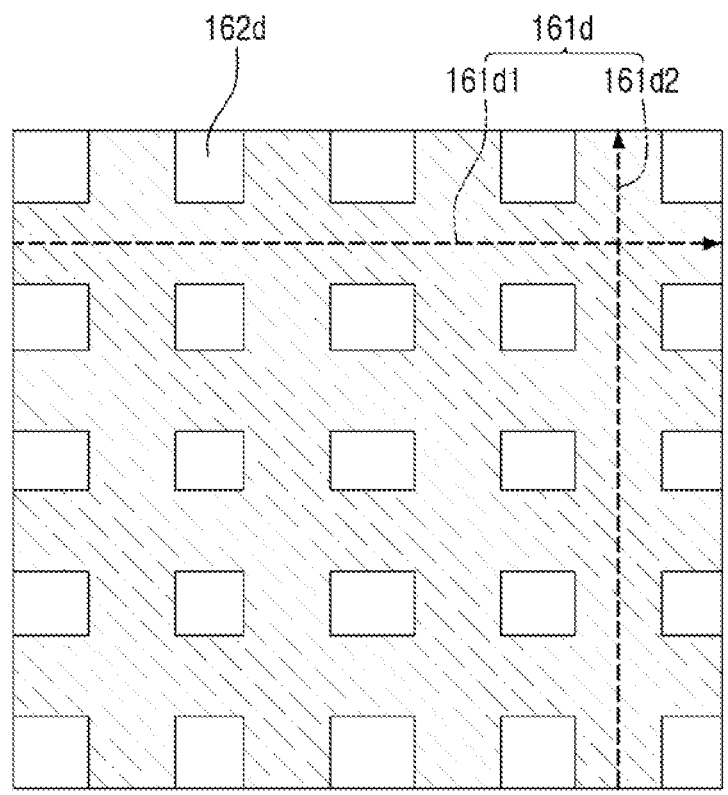
Figure 11:
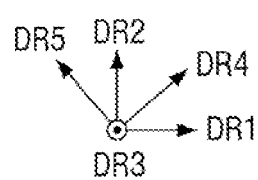

Referring to FIG. 11, a heating pattern 161d according to embodiments of the present disclosure may include a plurality of first heating patterns 161d1 extending in the first direction DR1 and a plurality of second heating patterns 161d2 extending in the second direction DR2.

The first heating patterns 161d1 and the second heating patterns 161d2 may cross each other, and an insulating adhesive layer 162d may be disposed in a rectangular shape in a plan view between parts of the heating pattern 161d.

Figure 12:
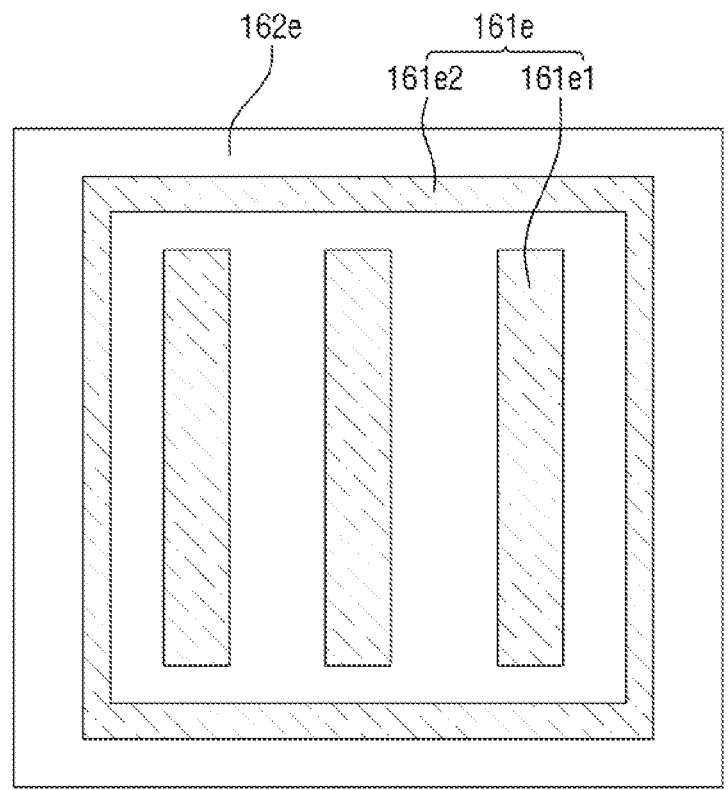
Figure 12:
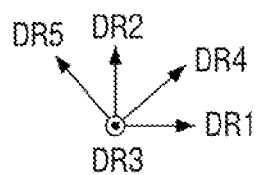

Referring to FIG. 12, a heating pattern 161e according to embodiments of the present disclosure may include a plurality of first heating patterns 161e1 extending in the second direction DR2 and a second heating pattern 161e2 shaped like a square ring and surrounding the first heating patterns 161e1. An insulating adhesive layer 162e may surround the second heating pattern 161e2.

Referring to FIGS. 8 through 12, the heating pattern 161 may be disposed in the insulating adhesive layer 162 to form various forms of patterns. Since the insulating adhesive layer 162 is disposed between parts of the heating pattern 161, the heating pattern 161 may be formed to have patterns, thus preventing warpage due to thermal expansion. Depending on embodiments of the present disclosure, the heating pattern 161 may have various types of patterns other than those in FIGS. 8 through 12.

Figure 13:
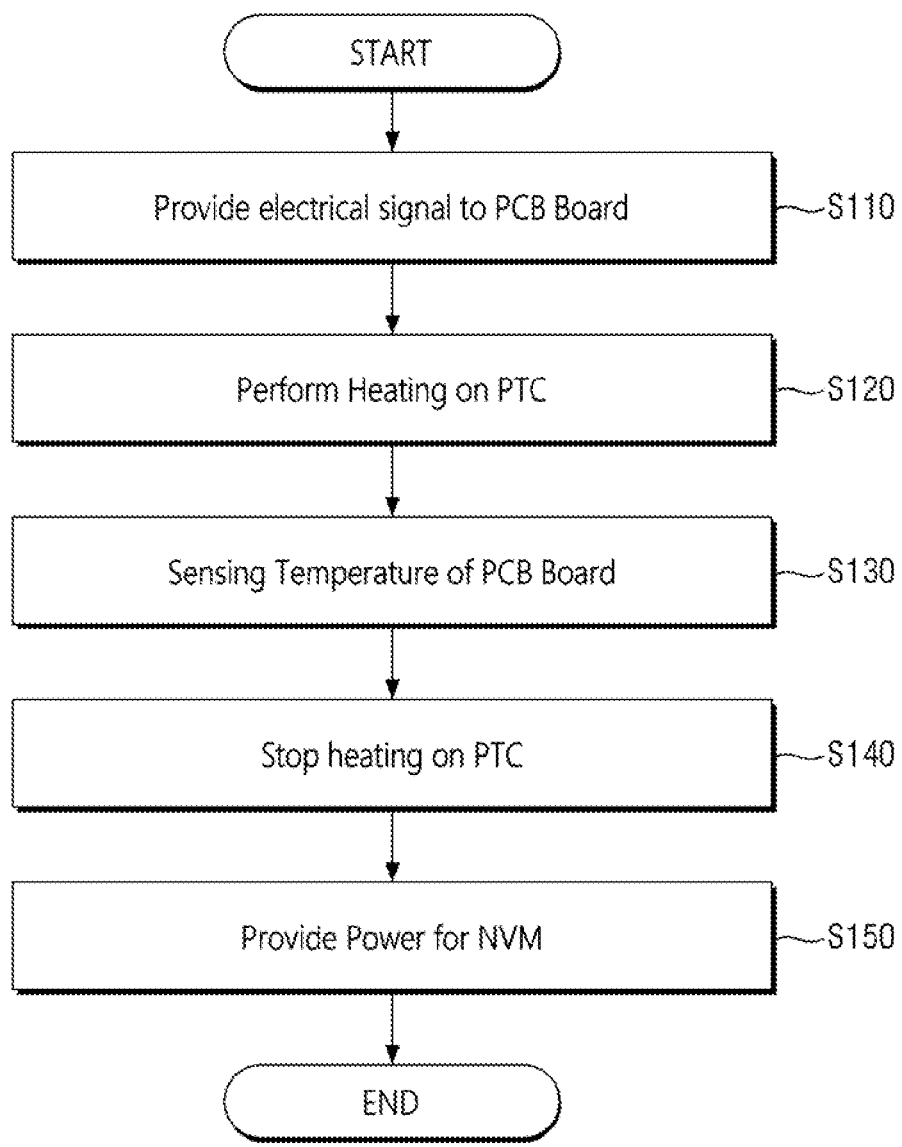
FIG. 13 is a flowchart illustrating the operation of a storage system according to embodiments of the present disclosure.
Figure 14:
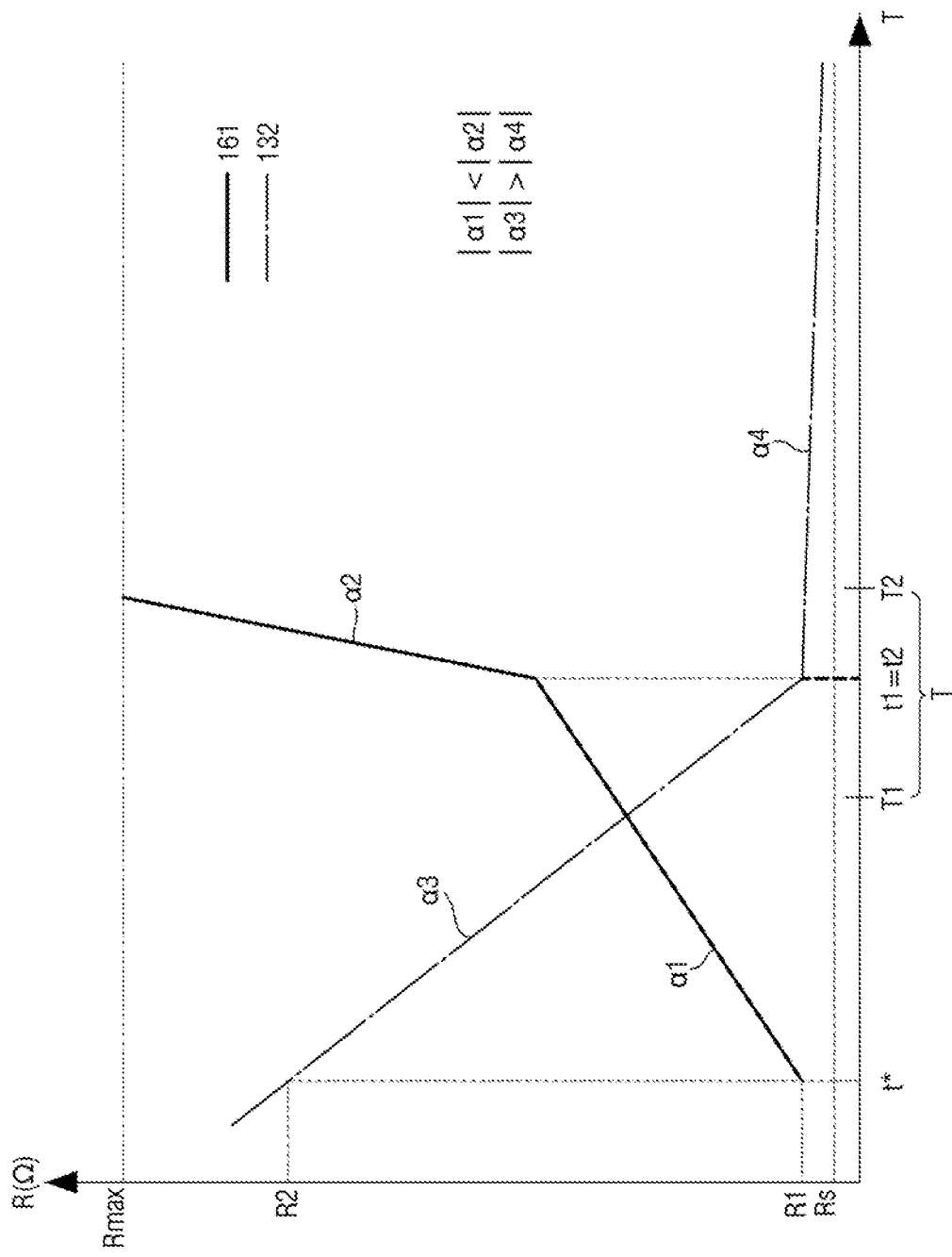
FIG. 14 is a graph for explaining the operation of the storage system according to the embodiments of the present disclosure.
Figure 15:
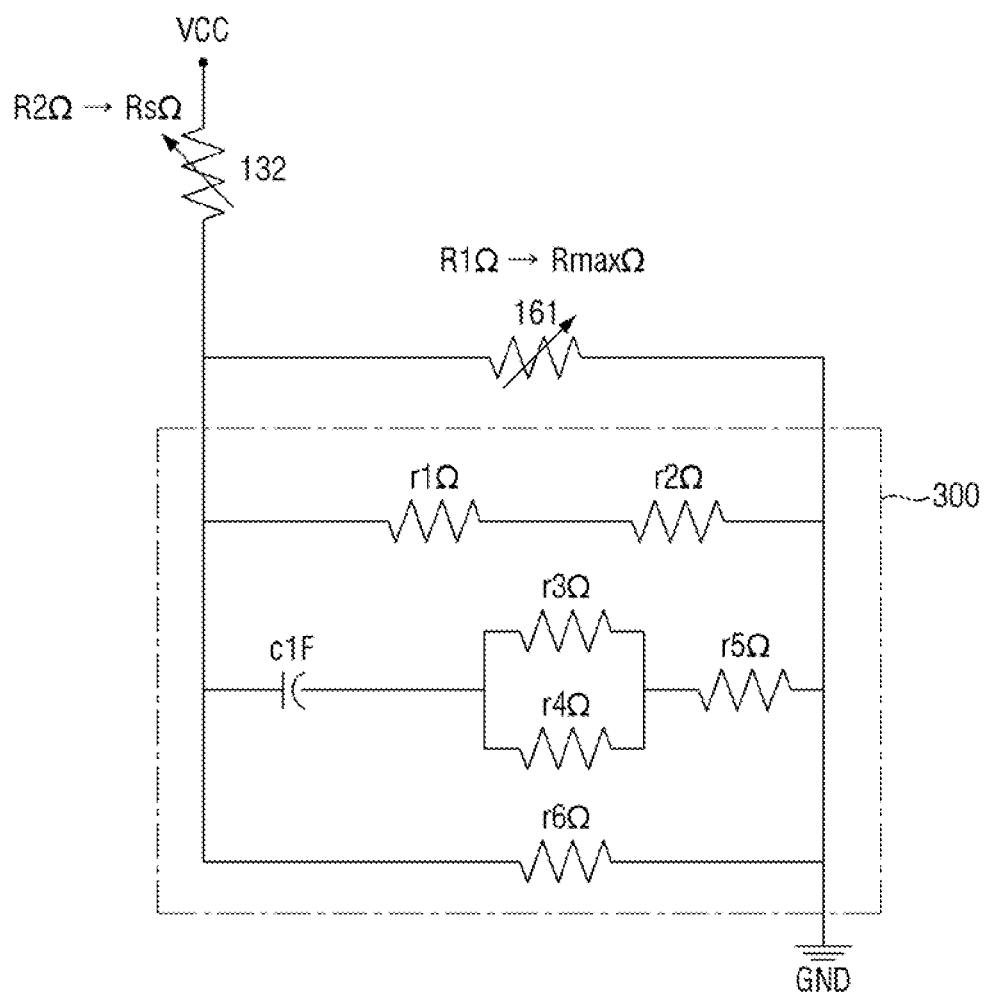
FIG. 15 is a diagram for explaining the operation of the storage system according to the embodiments of the present disclosure.

FIG. 13 is a flowchart illustrating the operation of a storage system according to embodiments of the present disclosure. FIG. 14 is a graph for explaining the operation of the storage system according to the embodiments of the present disclosure. FIG. 15 is a diagram for explaining the operation of the storage system according to the embodiments of the present disclosure.

FIG. 15 illustrates resistors and/or resistances of the NTC thermistor 132, the heating pattern 161 and the nonvolatile memory device 300 as well as a capacitor and/or capacitance of the nonvolatile memory device 300.

Referring to FIGS. 6, 7 and 13 through 15, an electrical signal or power is provided from an external source to a PCB 101a through a connector 130 (operation S110). The external source may be a component in the system 1000 of FIG. 1, for example, the external source may be the power supplying device 1470.

At the time when the electrical signal or power is provided in operation SI 10, the temperature of a heating pattern 161 is below a first critical temperature t1, and the temperature of an NTC thermistor 132 is a starting temperature t* below a second critical temperature t2.

At the starting temperature t*, a resistance value of the heating pattern 161 is R1, and R1 is lower than a resistance value of the heating pattern 161 at the first critical temperature t1 according to a characteristic of a positive thermal coefficient. At the starting temperature t*, a resistance value of the NTC thermistor 132 is R2, and R2 is higher than a resistance value of the NTC thermistor 132 at the second critical temperature t2 according to a characteristic of a negative thermal coefficient.

A heating operation is performed on the heating pattern 161 which is a PTC thermistor through the provided power (operation S120). Since the resistance value of the heating pattern 161 is relatively low at the starting temperature t*, a high current may flow through the heating pattern 161. The heating pattern 161 may perform a heating operation according to Equation 1 below, thereby increasing the temperature of the PCB 101a. According to Equation 1 below, the amount of heat generated by the heating pattern 161 is greatly affected by current. Therefore, when the same power is input, the lower the resistance, the greater the amount of heat generated by the heating pattern 161.

$$P=I^2R \quad (1).$$

The resistance value of the heating pattern 161 according to embodiments of the present disclosure may increase linearly according to a first thermal coefficient of resistance $\alpha 1$ in a temperature rise between the starting temperature t* and the first critical temperature t1. The resistance value of the NTC thermistor 132 according to embodiments of the present disclosure may decrease linearly according to a third thermal coefficient of resistance $\alpha 3$ in a temperature rise between the starting temperature t* and the second critical temperature t2.

The first critical temperature t1 according to embodiments of the present disclosure may be in the range of −5 to 25° C., and the second critical temperature t2 according to embodiments of the present disclosure may be in the range of −5 to 25° C. This critical temperature range T is a value directly connected to an appropriate driving temperature of a nonvolatile memory device. A first temperature point T1 may correspond to −5° C., and a second temperature point T2 may correspond to 25° C.

According to embodiments of the present disclosure, the first critical temperature t1 and the second critical temperature t2 may be the same.

As the resistance value of the NTC thermistor 132 decreases, the power input to the heating pattern 161 can be increased. Therefore, even if the resistance value of the heating pattern 161 increases as the temperature increases, the efficiency of the heating operation of the heating pattern 161 can be maintained. By maintaining the efficiency of the heating operation, the heating pattern 161 can rapidly increase the temperature of the PCB 101a.

As the resistance value of the NTC thermistor 132 decreases, the amount of power provided to a memory controller 200 and a nonvolatile memory device 300 may increase.

The first critical temperature t1 and the second critical temperature t2 are sensed through the NTC thermistor 132 (operation S130). The NTC thermistor 132 and the heating pattern 161 may sense the first critical temperature t1 and the second critical temperature t2 through a change in resistance value without a sensing operation of a temperature sensor 120.

The heating pattern 161 senses whether it has reached the first critical temperature t1 or whether the PCB 101a has reached a predetermined temperature, and the temperature sensor 120 generates a sensing signal SS (see FIG. 1) according to the sensing result. After the heating pattern 161 reaches the first critical temperature t1, the resistance value of the heating pattern 161 sharply increases according to a second thermal coefficient of resistance $\alpha 2$ greater than the first thermal coefficient of resistance $\alpha 1$. For example, the second thermal coefficient of resistance $\alpha 2$ has a large value approaching infinity.

The resistance value of the NTC thermistor 132 decreases according to a fourth thermal coefficient of resistance $\alpha 4$ smaller than the third thermal coefficient of resistance $\alpha 3$ after the second critical temperature t2 and becomes close to a convergence resistance Rs. The convergence resistance Rs according to embodiments of the present disclosure may be zero.

The memory controller 200 and the nonvolatile memory device 300 according to embodiments of the present disclosure can be driven and provided with constant, appropriate power through the resistance value of the NTC thermistor 132 after the second critical temperature t2. The second critical temperature t2 may be sensed through the appropriate power.

The heating pattern 161 stops the heating operation (operation S140). The resistance value of the heating pattern 161 is changed by the first critical temperature t1 sensed through operation S130 above, and the heating operation is stopped according to the change in resistance.

The temperature sensor 120 provides the generated sensing signal SS to the memory controller 200. In addition to the sensing of the NTC thermistor 132 and the heating pattern 161, the temperature sensor 120 may sense the first critical temperature t1 and the second critical temperature t2 and transmit the sensing signal SS to the memory controller 200 so that it can be driven together with the storage system 10.

The resistance value of the heating pattern 161 reaches a maximum resistance $R_{max}$ according to the magnitude of the second thermal coefficient of resistance $\alpha 2$ immediately after the first critical temperature t1 is reached. Since this is close to an open state, a current is blocked. Thus, the heating pattern 161 stops the heating operation because no current flows through the heating pattern 161, and an appropriate temperature for the operation of the nonvolatile memory device 300 can be maintained.

The memory controller 200 provides driving power to the nonvolatile memory device 300 according to the sensing signal SS and the sensing of the NTC thermistor 132 in operation S130 (operation S150).

Through the sensing of the NTC thermistor 132 or the temperature sensor 120, the nonvolatile memory device 300 may be driven at a temperature higher than the first critical temperature t1 and the second critical temperature t2. Thus, since the nonvolatile memory device 300 can operate at an appropriate driving temperature, the operational reliability of the nonvolatile memory device 300 can be increased.

Figure 16:
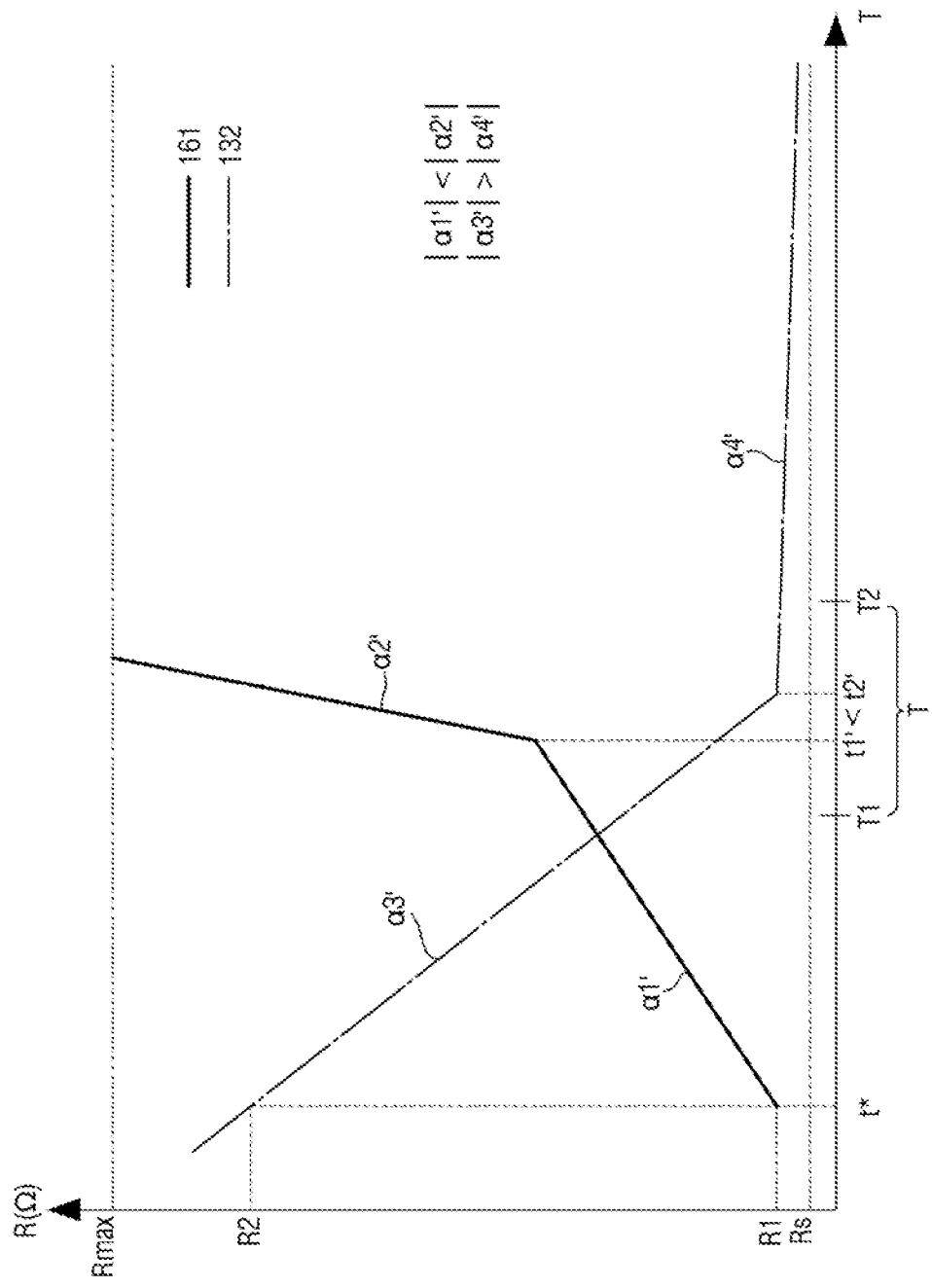
FIG. 16 is a graph for explaining the operation of a storage system according to embodiments of the present disclosure.

FIG. 16 is a graph for explaining the operation of a storage system according to embodiments of the present disclosure. A PCB 101a according to embodiments of the present disclosure will now be described with reference to FIG. 16, focusing on differences from the PCB 101a illustrated in FIG. 14.

A first critical temperature t1' of a heating pattern 161 and a second critical temperature t2' of an NTC thermistor 132 are within a critical temperature range T, but the second critical temperature t2' is higher than the first critical temperature t1'.

Therefore, since sensing of the second critical temperature t2' of the NTC thermistor 132 occurs after the first critical temperature t1' is reached, the providing of the driving power in operation S150 may occur after the second critical temperature t2', and thus, a nonvolatile memory device 300 may stably operate after the second critical temperature t2' is reached. Accordingly, the operational reliability of the nonvolatile memory device 300 is ensured, and a heating operation between the first critical temperature t1' and the second critical temperature t2' is performed by residual heat of the heating pattern 161.

Therefore, in an embodiment of the present disclosure in which the first critical temperature t1' is higher than the second critical temperature t2', a memory controller 200 can quickly drive the nonvolatile memory device 300.

Figure 17:
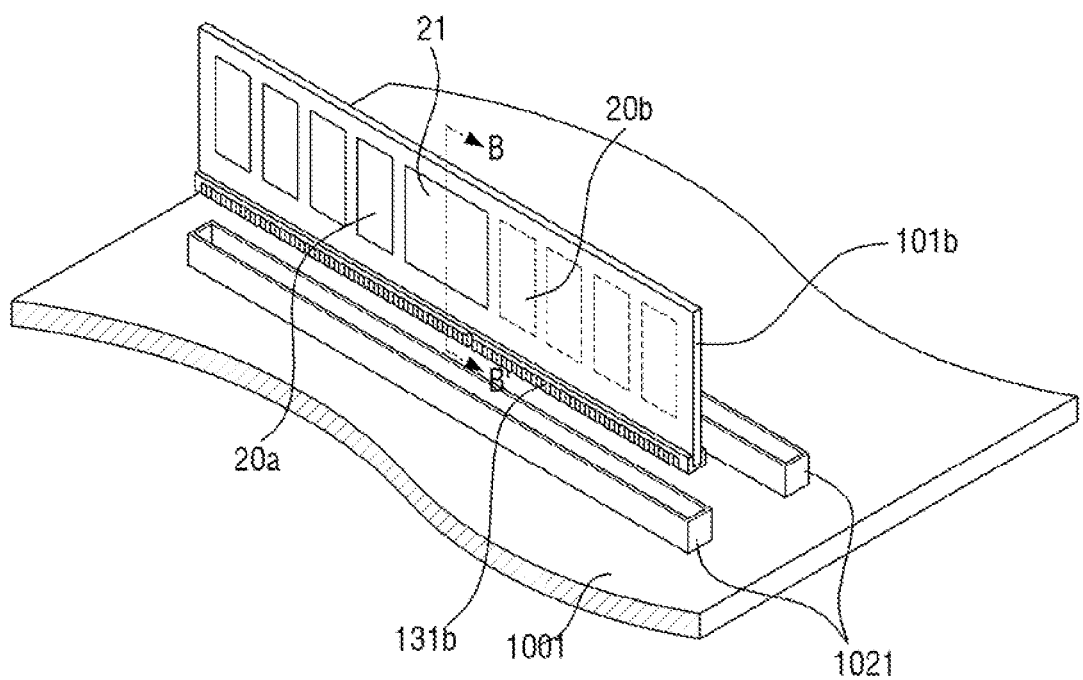
FIGS. 17 and 18 illustrate a storage system according to embodiments of the present disclosure.
Figure 18:
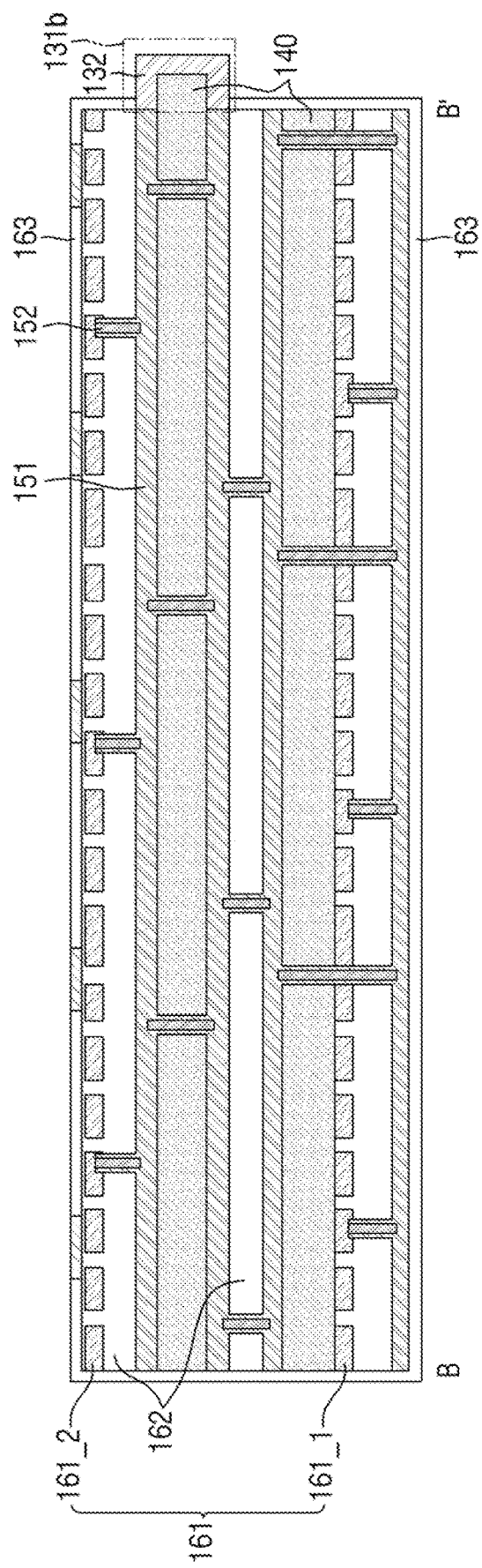

FIGS. 17 and 18 illustrate a storage system according to embodiments of the present disclosure. A PCB 101b according to embodiments of the present disclosure will now be described with reference to FIGS. 17 and 18, focusing on differences from the PCB 101a illustrated in FIGS. 6 and 7.

The PCB 101b may be applied to the memory 1020 of FIG. 1. A semiconductor memory module structure of a dual in memory module (DIMM) may be applied to the PCB 101b. The PCB 101b may correspond to the PCB 101a, and a pin 131b may correspond to one of the pins 131a.

Front volatile memory devices 20a, rear volatile memory devices 20b, and a redriving buffer 21 may be mounted on the PCB 101b.

The front volatile memory devices 20a and the rear volatile memory devices 20b are DRAMs. Examples of DRAMs may include synchronous dynamic random access memories (SDRAMs) and double data rate dynamic random access memories (DDR DRAMs), for example, DDR-3 SDRAM, DDR-4 SDRAM and DDR-5 SDRAM. In addition, other synchronous DRAMs may include Rambus DRAMs. In addition to DRAMs, various memories such as SRAMs and nonvolatile memories may be employed as the front volatile memory devices 20a and the rear volatile memory devices 20b.

The redriving buffer 21 may transmit an electrical signal received from the pin 131b to each of the front volatile memory devices 20a and the rear volatile memory devices 20b.

The pin 131b may be inserted into a connector insertion part 1021 attached to a main board 1001, and the pin 131b and the connector insertion part 1021 may electrically connect the PCB board 101b and the main board 1001. The NTC thermistor 132 may surround a protruded end of the core layer 140.

Figure 19:
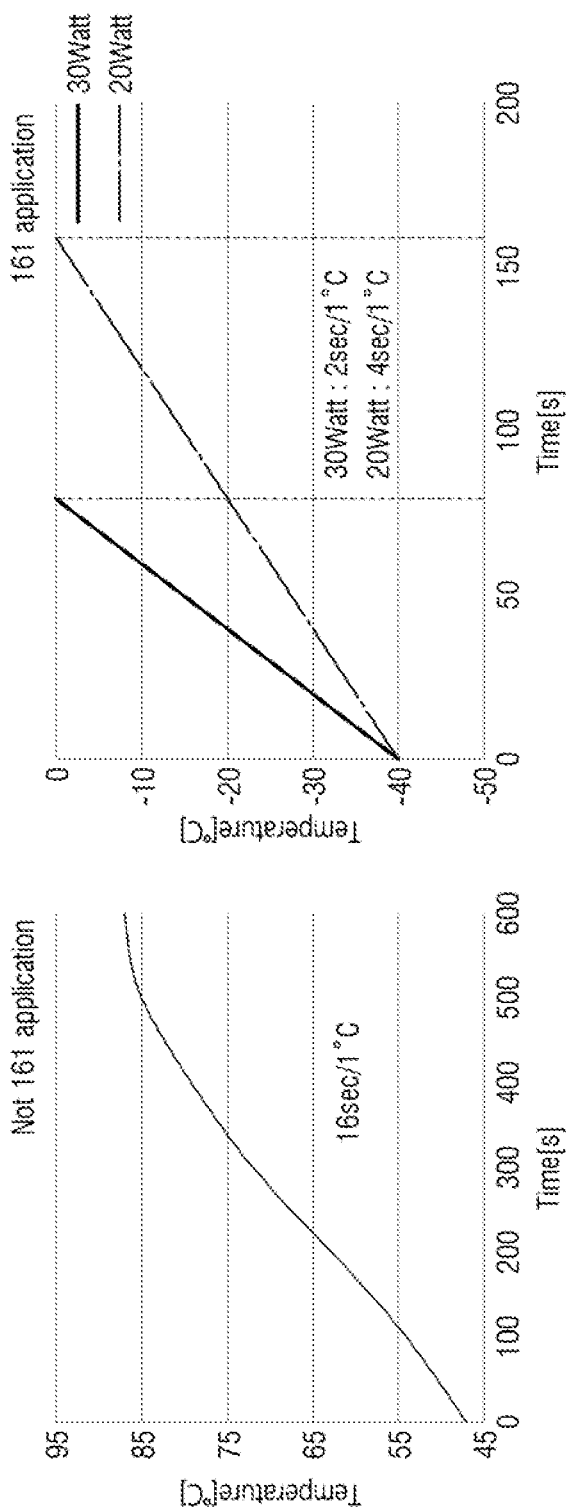
FIG. 19 is a graph for explaining the effect of a storage system according to embodiments of the present disclosure.

FIG. 19 is a graph for explaining the effect of a storage system according to embodiments of the present disclosure.

In the case of a storage device to which a PCB 101a/101b of the present disclosure is not applied, 600 seconds or more is required to increase the temperature from 45° C. to 85° C. through heat generation by the operation of the storage device, and 16 seconds is required to increase the temperature of the storage device by 1° C.

In a storage system 10 of the present disclosure to which the PCB board 101a/101b is applied, when a power of 20 watt is provided through a pin 131, 160 seconds is required to increase the temperature from −40° C. to 0° C., and 4 seconds is required to increase the temperature of the storage device by 1° C.

In the storage system 10 of the present disclosure, when a power of 30 watt is provided through the pin 131, 80 seconds is required to increase the temperature from −40° C. to 0° C., and 2 seconds is required to increase the temperature of the storage device by 1° C.

For example, the storage system 10 of the present disclosure in an automotive computer system can rapidly and efficiently increase the temperature from −40° C. to an appropriate driving temperature of 0° C. through a heating pattern 161 and an NTC thermistor 132. In addition, a memory device can be driven at an appropriate driving temperature through a polyswitch operation of the NTC thermistor 132 included in the PCB board 101a/101b, thereby increasing the operational reliability of the memory device.

It is to be understood that those skilled in the art will appreciate that many variations and modifications may be made to the embodiments described herein without departing from the scope of the present disclosure. Therefore, the present disclosure is not limited to the embodiments described herein.

What is claimed is:

1. A printed circuit board (PCB), comprising:
a negative thermal coefficient (NTC) thermistor which provides an electrical signal received from outside the PCB, wherein an electrical resistance of the NTC thermistor varies according to a negative thermal coefficient; and
a heating pattern which receives the electrical signal from the NTC thermistor, wherein the heating pattern comprises a positive thermal coefficient (PTC) thermistor with an electrical resistance that varies according to a positive thermal coefficient,
wherein the PTC thermistor has a first thermal coefficient of resistance at a first critical temperature or below and changes to a second thermal coefficient of resistance above the first critical temperature, and the NTC thermistor has a third thermal coefficient of resistance at a second critical temperature or below and changes to a fourth thermal coefficient of resistance above the second critical temperature.

2. The PCB of claim 1, wherein the first critical temperature is in the range of −5 to 25° C.

3. The PCB of claim 2, wherein the first critical temperature and the second critical temperature are the same.

4. The PCB of claim 2, wherein the second critical temperature is in the range of −5 to 25° C. and is higher than the first critical temperature.

5. The PCB of claim 1, wherein a magnitude of the first thermal coefficient of resistance is smaller than a magnitude of the second thermal coefficient of resistance.

6. The PCB of claim 1, wherein a magnitude of the third thermal coefficient of resistance is greater than a magnitude of the fourth thermal coefficient of resistance.

7. The PCB of claim 1, wherein the heating pattern is included in a prepreg layer.

8. The PCB of claim 7, wherein the heating pattern comprises a first heating pattern extending in a first direction and a second heating pattern extending in a second direction intersecting the first direction.

9. The PCB of claim 7, wherein the heating pattern comprises a first heating pattern layer and a second heating pattern layer at least partially overlapping the first heating pattern layer in a plan view.

10. The PCB of claim 1, further comprising a temperature sensor which measures the temperature of the heating pattern, wherein the temperature sensor generates a sensing signal when the heating pattern reaches the first critical temperature.

11. A printed circuit board (PCB), comprising:
a connector which provides an electrical signal received from outside the PCB; and
a heating pattern which receives the electrical signal from the connector, wherein the heating pattern comprises a positive thermal coefficient (PTC) thermistor with an electrical resistance that varies according to a positive thermal coefficient,
wherein the PTC thermistor has a first thermal coefficient of resistance at a first critical temperature or below and changes to a second thermal coefficient of resistance above the first critical temperature, and the first critical temperature is in the range of −5 to 25° C.

12. The PCB of claim 11, wherein the connector comprises a negative thermal coefficient (NTC) thermistor with an electrical resistance that varies according to a negative thermal coefficient, and the NTC thermistor has a third thermal coefficient of resistance at a second critical temperature or below and changes to a fourth thermal coefficient of resistance above the second critical temperature.

13. The PCB of claim 12, wherein the second critical temperature is in the range of −5 to 25° C. and is higher than the first critical temperature.

14. The PCB of claim 11, wherein a magnitude of the first thermal coefficient of resistance is smaller than a magnitude of the second thermal coefficient of resistance.

15. The PCB of claim 11, wherein the heating pattern is disposed in a prepreg layer.

16. A storage system, comprising:
a memory device which stores data;
a memory controller which requests the memory device to program the data; and
a printed circuit board (PCB) on which the memory device and the memory controller are disposed and which provides an electrical signal to the memory controller,
wherein the PCB comprises:
a negative thermal coefficient (NTC) thermistor which provides the electrical signal received from outside the PCB, wherein an electrical resistance of the NTC thermistor varies according to a negative thermal coefficient; and
a heating pattern which receives the electrical signal from the NTC thermistor and comprises a positive thermal coefficient (PTC) thermistor, wherein an electrical resistance of the PTC thermistor varies according to a positive thermal coefficient,
wherein the PTC thermistor has a first thermal coefficient of resistance at a first critical temperature or below and changes to a second thermal coefficient of resistance above the first critical temperature, and the NTC thermistor has a third thermal coefficient of resistance at a second critical temperature or below and changes to a fourth thermal coefficient of resistance above the second critical temperature.

17. The storage system of claim 16, wherein the first and second critical temperatures are in the range of −5 to 25° C., and the second critical temperature is higher than the first critical temperature.

18. The storage system of claim 16, wherein the heating pattern is included in a prepreg layer and comprises a first heating pattern layer and a second heating pattern layer closer to the memory device than the first heating pattern layer.

19. The storage system of claim 16, wherein a magnitude of the first thermal coefficient of resistance is smaller than a magnitude of the second thermal coefficient of resistance.

20. The storage system of claim 16, further comprising a temperature sensor which measures the temperature of the PCB board, wherein the temperature sensor provides a sensing signal to the memory controller when the temperature of the PCB board reaches a predetermined temperature.

* * * * *